(12) United States Patent
Inoue et al.

(10) Patent No.: US 12,109,779 B2
(45) Date of Patent: Oct. 8, 2024

(54) COPPER-CLAD LAMINATE, WIRING BOARD, AND COPPER FOIL WITH RESIN

(71) Applicant: PANASONIC INTELLECTUAL PROPERTY MANAGEMENT CO., LTD., Osaka (JP)

(72) Inventors: Yuki Inoue, Fukushima (JP); Tatsuya Arisawa, Fukushima (JP); Yuki Kitai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 43 days.

(21) Appl. No.: 17/768,170

(22) PCT Filed: Oct. 15, 2020

(86) PCT No.: PCT/JP2020/038933
§ 371 (c)(1),
(2) Date: Apr. 11, 2022

(87) PCT Pub. No.: WO2021/079819
PCT Pub. Date: Apr. 29, 2021

(65) Prior Publication Data
US 2023/0054257 A1    Feb. 23, 2023

(30) Foreign Application Priority Data

Oct. 25, 2019  (JP) .................. 2019-194375

(51) Int. Cl.
*B32B 15/20*  (2006.01)
*B32B 15/082*  (2006.01)

(52) U.S. Cl.
CPC ............ *B32B 15/20* (2013.01); *B32B 15/082* (2013.01)

(58) Field of Classification Search
None
See application file for complete search history.

(56) References Cited

U.S. PATENT DOCUMENTS

| | | | |
|---|---|---|---|
| 2005/0079364 A1* | 4/2005 | van Ooij ................ | C09D 4/00 428/447 |
| 2007/0178300 A1* | 8/2007 | Amla ..................... | B32B 15/08 428/141 |

(Continued)

FOREIGN PATENT DOCUMENTS

| | | | | |
|---|---|---|---|---|
| EP | 0031852 | * | 7/1981 | ............ B32B 15/08 |
| JP | 2002/363232 | * | 12/2002 | ............ C08F 290/00 |

(Continued)

OTHER PUBLICATIONS

Kato—JP 2002-363232 A—ISR D3—MT—curable composition—2002 (Year: 2002).*

(Continued)

*Primary Examiner* — John Vincent Lawler
(74) *Attorney, Agent, or Firm* — GREENBLUM & BERNSTEIN, P.L.C.

(57) ABSTRACT

A copper-clad laminate includes an insulating layer that contains a cured product of a resin composition containing a polymer having a structural unit represented by the following Formula (1) in a molecule, and a metal foil that is laminated on the insulating layer, and in which a chromium element amount, on an exposed surface of the insulating layer exposed by an etching treatment of the copper-clad laminate is 7.5 at % or less with respect to a total element amount on the exposed surface, and ten-point average roughness of the exposed surface is 2.0 μm or less.

(Continued)

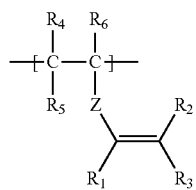

(1)

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

12 Claims, 5 Drawing Sheets

(56) References Cited

U.S. PATENT DOCUMENTS

| | | | |
|---|---|---|---|
| 2017/0164469 A1 | 6/2017 | Kitai et al. | |
| 2018/0206345 A1* | 7/2018 | Yoneda | B32B 5/022 |
| 2018/0297329 A1* | 10/2018 | Kitai | H05K 1/024 |
| 2019/0194505 A1* | 6/2019 | Liu | C09J 123/26 |
| 2021/0108073 A1 | 4/2021 | Kawabe et al. | |

FOREIGN PATENT DOCUMENTS

| | | | | |
|---|---|---|---|---|
| JP | 2002363232 A | * | 12/2002 | ............ C08F 290/00 |
| JP | 2003-298230 A | | 10/2003 | |
| JP | 2014/229775 | * | 12/2014 | ............... H05K 3/38 |
| JP | 2014229775 A | * | 12/2014 | ............... H05K 3/38 |
| JP | 2016-028885 A | | 3/2016 | |
| JP | 2018-039995 A | | 3/2018 | |
| WO | WO-2014192895 A1 | * | 12/2014 | ......... C23C 18/1653 |
| WO | 2016/104748 A1 | | 6/2016 | |
| WO | WO-2018181842 A1 | * | 10/2018 | ............. B32B 15/08 |

OTHER PUBLICATIONS

Endo—JP 2014-229775 A—ISR D1—MT—wiring board w-chrome—2014 (Year: 2014).*
Ishii—WO 2014-192895 A1—ISR D2—MT—copper-clad laminate w-chrome layer—2014 (Year: 2014).*
Sigma-Aldrich—divinyl benzene—Jul. 18, 2023 (Year: 2023).*
Kawabe—WO 2018-181842 A1—IDS—MT—vinyl aromatic copolymer—2018 (Year: 2018).*
CNC Cookbook—Complete Surface Finish Chart, Symbols & Roughness Conversion Tables (Year: 2018).*
ISR issued in International Patent Application No. PCT/JP2020/038933, Dec. 22, 2020, translation.

* cited by examiner

COPPER-CLAD LAMINATE, WIRING BOARD, AND COPPER FOIL WITH RESIN

TECHNICAL FIELD

The present invention relates to a copper-clad laminate, a wiring board, and a copper foil with resin.

BACKGROUND ART

As the information processing quantity by various kinds of electronic equipment increases, mounting technologies such as high integration of semiconductor devices to be mounted, densification of wiring, and multi-layering are rapidly progressing. Wiring boards used in various kinds of electronic equipment are required to be, for example, high-frequency compatible wiring boards such as a millimeter-wave radar board for in-vehicle use.

When signals are transmitted to the wiring provided on wiring boards, transmission loss due to the conductor forming the wiring, transmission loss due to the dielectric around the wiring, and the like occur. It is known that these transmission losses are particularly likely to occur when high frequency signals are transmitted to the wiring provided on wiring boards. For this reason, wiring boards are required to diminish the loss at the time of signal transmission in order to increase the signal transmission speed. This is particularly required for wiring boards supporting high frequencies. In order to satisfy this requirement, it is conceivable to use materials having a low dielectric constant and a low dielectric loss tangent as a substrate material for manufacturing the insulating layer constituting wiring boards. Examples of such a substrate material include a resin composition containing polyphenylene ether. Examples of a metal-clad laminate obtained using such a material having a low dielectric constant and a low dielectric loss tangent as a substrate material include the metal-clad laminate described in Patent Literature 1.

Patent Literature 1 describes a metal-clad laminate which includes a cured insulating layer, a metal layer bonded to the insulating layer containing a polyphenylene ether compound, and an intermediate layer which contains a silane compound and is interposed between the insulating layer and the metal layer and in which the metal layer has a joint surface bonded to the insulating layer with the intermediate layer interposed therebetween and the ten-point average roughness Rz of the joint surface is 0.5 μm or more and 4 μm or less. According to Patent Literature 1, it is disclosed that a metal-clad laminate is obtained from which a printed wiring board with diminished loss at the time of signal transmission can be manufactured.

As described above, wiring boards such as printed wiring boards are required to have a further increased signal transmission speed in order to support high frequencies. Wiring boards used in various kinds of electronic equipment are also required to be hardly affected by changes in the external environment, and the like. For example, high heat resistance is required so that delamination does not occur at the time of heating. In order to satisfy these requirements, various studies on copper-clad laminates, wiring boards, and copper foils with resins have been conducted.

CITATION LIST

Patent Literature

Patent Literature 1: JP 2016-28885 A

SUMMARY OF INVENTION

The present invention has been made in view of such circumstances, and an object thereof is to provide a copper-clad laminate and a copper foil with resin from which a wiring board having a high signal transmission speed and high heat resistance can be suitably manufactured. Another object of the present invention is to provide a wiring board having a high signal transmission speed and high heat resistance.

An aspect of the present invention is a copper-clad laminate including an insulating layer, and a copper foil existing to be in contact with at least one surface of the insulating layer, in which the insulating layer contains a cured product of a resin composition containing a polymer having a structural unit represented by the following Formula (1) in a molecule, a chromium element amount, on an exposed surface on which the insulating layer is exposed by an etching treatment of the copper-clad laminate with a copper chloride solution, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness.

[Chem. 1]

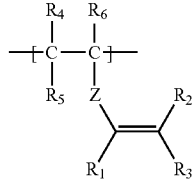

(1)

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

Another aspect of the present invention is a copper foil with resin including a resin layer, and a copper foil existing to be in contact with at least one surface of the resin layer, in which the resin layer contains a resin composition containing a polymer having a structural unit represented by the following Formula (1) in a molecule or a semi-cured product of the resin composition, a chromium element amount, on an exposed surface on which the cured resin layer is exposed by an etching treatment of the copper foil existing to be in contact with a surface of the cured resin layer with a copper chloride solution when the resin layer provided in the copper foil with resin is cured, measured by X-ray photoelectron spectroscopy is 7.5 at % or less with respect to a total element amount measured by X-ray photoelectron spectroscopy, and a surface roughness of the exposed surface is 2.0 μm or less in terms of ten-point average roughness.

DESCRIPTION OF EMBODIMENTS

Figure 1:
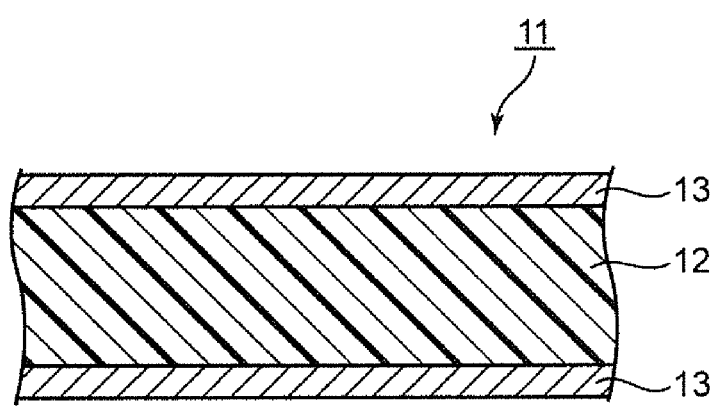
FIG. 1 is a schematic sectional view illustrating an example of a copper-clad laminate according to an embodiment of the present invention.

In a wiring board obtained by forming wiring by partially removing the copper foil provided in the copper-clad laminate, wiring formed of copper foil does not exist between these insulating layers even when another insulating layer is formed on the surface of the insulating layer exposed by the wiring formation. From this fact, it has been considered that the delamination between the insulating layers is not affected by the copper foil provided in the copper-clad laminate used to obtain a wiring board.

However, according to the studies by the present inventors, it has been found that susceptibility to delamination that occurs between the insulating layers differs depending on the copper foil provided in the copper-clad laminate. The present inventors have presumed that the exposed surface and another insulating layer are suitably attached to each other and the state of the exposed surface does not affect the occurrence of delamination when a conductor derived from copper foil does not exist at all on the exposed surface that is the surface of the insulating layer exposed by wiring formation. From this fact, the present inventors have presumed that metal components derived from the copper foil may slightly remain on the exposed surface when the copper foil in the copper-clad laminate is removed by etching. The present inventors have presumed that the state of the exposed surface is greatly affected by the surface roughness. The present inventors have conducted various studies on the effects of the remaining metal components and surface roughness and, as a result, found out that the susceptibility to delamination that occurs between the insulating layers differs depending on the amount of chromium element existing on the exposed surface on which the insulating layer is exposed by the etching treatment of the copper-clad laminate with a copper chloride solution and the surface roughness.

As a result of various studies, the present inventors have found out that occurrence of the delamination can be suppressed in a wiring board obtained using a copper-clad laminate in which the exposed surface on which the insulating layer is exposed by the etching treatment of the copper-clad laminate with a copper chloride solution has a predetermined chromium element amount and a predetermined surface roughness. In other words, the present inventors have found out that occurrence of the delamination can be suppressed in a wiring board obtained using a copper-clad laminate in which the chromium element amount and surface roughness of the exposed surface on which the insulating layer is exposed by a predetermined etching treatment are predetermined values without regulating the copper foil removal conditions (etching treatment conditions) and the copper foil composition. From these facts, the present invention as described below has been conceived.

Hereinafter, embodiments according to the present invention will be described, but the present invention is not limited thereto.

[Copper-Clad Laminate]

The copper-clad laminate according to the embodiments of the present invention includes an insulating layer and a copper foil existing to be in contact with at least one surface of the insulating layer. As illustrated in FIG. 1, this copper-clad laminate 11 includes an insulating layer 12 and copper foils 13 disposed so as to be in contact with both surfaces of the insulating layer 12.

The copper-clad laminate may be provided with a copper foil in contact with only one surface of the insulating layer. FIG. 1 is a schematic sectional view illustrating the configuration of the copper-clad laminate 11 according to the present embodiment.

In the copper-clad laminate 11, the insulating layer 12 contains a cured product of a resin composition containing a polymer having a structural unit represented by the following Formula (1) in the molecule. In the copper-clad laminate 11, the chromium element amount on the exposed surface on which the insulating layer 12 is exposed by an etching treatment of the copper-clad laminate 11 with a copper chloride solution measured by X-ray photoelectron spectroscopy (XPS) is 7.5 at % or less with respect to the total element amount measured by XPS. In the copper-clad laminate 11, the surface roughness of the exposed surface is 2.0 μm or less in terms of ten-point average roughness.

[Chem. 2]

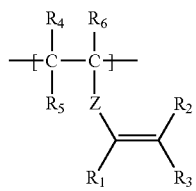

(1)

In Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

In such a copper-clad laminate, it is first considered that the heat resistance of the insulating layer can be enhanced since the cured product contained in the insulating layer is a cured product obtained by curing a resin composition containing the polymer.

As described above, the present inventors have found out that the delamination that occurs between the insulating layer between wirings and another insulating layer when another insulating layer is formed on the surface of the insulating layer existing between wirings is also affected by the copper foil that originally has existed even though a copper foil does not exist between the insulating layers in a wiring board manufactured from a copper-clad laminate. From this fact, it is considered that the etching residue derived from the copper foil exists on the exposed surface on which the insulating layer is exposed by an etching treatment. The present inventors have presumed that delamination is likely to occur at the time of heating when a compound containing a chromium element exists as this etching residue. It is considered that the amount of chromium element also existing on the surface of the insulating layer existing between the wirings in a wiring board manufactured from the copper-clad laminate, namely, the amount of a compound containing a chromium element is small when the amount of chromium element existing on the exposed surface is small as described above. From this fact, it is considered that the copper-clad laminate exhibits high heat resistance so that delamination can be sufficiently suppressed even when heating is performed.

From the above, it is considered that the copper-clad laminate exhibits high heat resistance.

The dielectric constant and the dielectric loss tangent are low since the cured product contained in the insulating layer is a cured product obtained by curing a resin composition containing the polymer. From this fact, it is considered that it is possible to diminish the transmission loss caused by the dielectric around the wiring and increase the signal transmission speed in this wiring board.

It is considered that the smoothness of the contact surface between the copper foil and the insulating layer is also high since the surface roughness of the exposed surface is low. From this fact, it is considered that the smoothness of the contact surface between the wiring and the insulating layer is also high in a wiring board obtained from the copper-clad laminate. It is considered that the signal for transmitting the wiring is concentrated near the surface of the conductor constituting the wiring by the skin effect. It is considered that this effect is more remarkable as the signal for transmitting the wiring has a higher frequency. As the contact surface between the wiring and the insulating layer is smooth, the signal flowing through the wiring flows near the surface having high smoothness and the transmission distance is shorter. From this fact, it is considered that it is possible to diminish the transmission loss caused by the conductor forming the wiring and increase the signal transmission speed in this wiring board.

From this fact, it is considered that it is possible to diminish the transmission loss caused by the conductor forming the wiring and the transmission loss caused by the dielectric around the wiring and increase the signal transmission speed in this wiring board.

From the above, it is considered that the copper-clad laminate is a copper-clad laminate from which a wiring board having a high signal transmission speed and high heat resistance can be suitably manufactured.

(Resin Composition)

The resin composition contains the polymer as described above.

(Polymer)

The polymer is not particularly limited as long as it is a polymer having the structural unit represented by Formula (1) in the molecule. The polymer may have a structural unit other than the structural unit represented by Formula (1) as long as it is a polymer having the structural unit represented by Formula (1) in the molecule. The polymer may include a repeating unit in which the structural unit represented by Formula (1) is repeatedly bonded, or the polymer may be a polymer in which a repeating unit in which the structural unit represented by Formula (1) is repeatedly bonded and a repeating unit in which a structural unit other than the structural unit represented by Formula (1) is repeatedly bonded are randomly bonded. In other words, the polymer may be a block copolymer or a random copolymer when the polymer has a structural unit other than the structural unit represented by Formula (1).

The arylene group represented by Z in Formula (1) is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group represented by $R_1$ to $R_3$ in Formula (1) is not particularly limited, and for example, an alkyl group having 1 to 18 carbon atoms is preferable and an alkyl group having 1 to 10 carbon atoms is more preferable. Specific examples thereof include a methyl group, an ethyl group, a propyl group, a hexyl group, and a decyl group.

The alkyl group having 1 to 6 carbon atoms, which is represented by $R_4$ to $R_6$ in Formula (1), is not particularly limited, and specific examples thereof include a methyl group, an ethyl group, a propyl group, and a hexyl group.

It is preferable that the polymer includes an aromatic polymer having a structural unit derived from a bifunctional aromatic compound in which two carbon-carbon unsaturated double bonds are bonded to an aromatic ring as the structural unit represented by Formula (1). The structural unit derived from a bifunctional aromatic compound is a structural unit obtained by polymerizing the bifunctional aromatic compound. In the present specification, the aromatic polymer is also referred to as a divinyl aromatic polymer.

The bifunctional aromatic compound is not particularly limited as long as it is a bifunctional aromatic compound in which two carbon-carbon unsaturated double bonds are bonded to an aromatic ring. Examples of the bifunctional aromatic compound include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof. Among these, the bifunctional aromatic compound is preferably divinylbenzene such as m-divinylbenzene and p-divinylbenzene, more preferably p-divinylbenzene.

The aromatic polymer may have not only a structural unit derived from the bifunctional aromatic compound but also another structural unit. Examples of the other structural unit include a structural unit derived from a monofunctional aromatic compound in which one carbon-carbon unsaturated double bond is bonded to an aromatic ring, a structural unit derived from a trifunctional aromatic compound in which three carbon-carbon unsaturated double bonds are bonded to an aromatic ring, structural units derived from indenes, and structural units derived from acenaphthylenes. The structural unit derived from a monofunctional aromatic compound is a structural unit obtained by polymerizing the monofunctional aromatic compound. The structural unit derived from a trifunctional aromatic compound is a structural unit obtained by polymerizing the trifunctional aromatic compound. The structural units derived from indenes are structural units obtained by polymerizing indenes. The structural units derived from acenaphthylenes are structural units obtained by polymerizing acenaphthylenes.

In the monofunctional aromatic compound, it is only required that one carbon-carbon unsaturated double bond is bonded to an aromatic ring, and a group other than the carbon-carbon unsaturated double bond may be bonded to the aromatic ring. Examples of the monofunctional aromatic compound include a monofunctional aromatic compound in which one carbon-carbon unsaturated double bond is bonded to an aromatic ring and a group other than this carbon-carbon unsaturated double bond is not bonded the aromatic ring and a monofunctional aromatic compound in which one carbon-carbon unsaturated double bond is bonded to an aromatic ring and an alkyl group such as an ethyl group is further bonded to the aromatic ring.

Examples of the monofunctional aromatic compound in which one carbon-carbon unsaturated double bond is bonded to an aromatic ring and a group other than this carbon-carbon unsaturated double bond is not bonded the aromatic ring include styrene, 2-vinylbiphenyl, 3-vinylbiphenyl, 4-vinylbiphenyl, 1-vinylnaphthalene, 2-vinylnaphthalene, and α-alkyl-substituted styrene. Examples of the α-alkyl-substituted styrene include α-methylstyrene, α-ethylstyrene, α-propylstyrene, α-n-butylstyrene, α-isobutylstyrene, α-t-butylstyrene, α-n-pentylstyrene, α-2-methylbutylstyrene, α-3-methylbutyl-2-styrene, α-t-butylstyrene, α-t-butylstyrene, α-n-pentylstyrene, α-2-methylbutylstyrene, α-3-methylbutylstyrene, α-t-pentylstyrene, α-n-hexylstyrene, α-2-methylpentylstyrene, α-3-methylpentylstyrene, α-1-methylpentylstyrene, α-2,2-dimethylbutylstyrene, α-2,3-dimethylbutylstyrene, α-2,4-dimethylbutylstyrene, α-3,3-dimethylbutylstyrene, α-3,4-dimethylbutylstyrene, α-4,4-dimethylbutylstyrene, α-2-ethylbutylstyrene, α-1-ethylbutylstyrene, α-cyclohexylstyrene, and α-cyclohexylstyrene. These may be used singly or in combination of two or more kinds thereof.

Examples of monofunctional aromatic compounds in which one carbon-carbon unsaturated double bond is bonded to an aromatic ring and an alkyl group is further bonded to the aromatic ring include a nuclear alkyl-substituted aromatic compound and alkoxy-substituted styrene.

Examples of the nuclear alkyl-substituted aromatic compound include an ethyl vinyl aromatic compound in which an alkyl group bonded to an aromatic ring is an ethyl group, nuclear alkyl-substituted styrene in which an alkyl group is bonded to styrene as an aromatic ring, and nuclear alkyl-substituted aromatic compounds (other nuclear alkyl-substituted aromatic compounds) other than the ethyl vinyl aromatic compound and the nuclear alkyl-substituted styrene.

Examples of the ethyl vinyl aromatic compound include o-ethyl vinyl benzene, m-ethylvinylbenzene, p-ethylvinylbenzene. 2-vinyl-2'-ethylbiphenyl, 2-vinyl-3'-ethylbiphenyl, 2-vinyl-4'-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4-ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene.

Examples of the nuclear alkyl-substituted styrene include m-methylstyrene, p-methylstyrene, m-propylstyrene, p-propylstyrene, m-n-butylstyrene, p-n-butylstyrene, m-t-butylstyrene, p-t-butylstyrene, m-n-hexylstyrene, p-n-hexylstyrene, m-cyclohexylstyrene, and p-cyclohexylstyrene.

Examples of the other nuclear alkyl-substituted aromatic compounds include 2-vinyl-2'-propylbiphenyl, 2-vinyl-3'-propylbiphenyl, 2-vinyl-4'-propylbiphenyl, 3-vinyl-2'-propylbiphenyl, 3-vinyl-3'-propylbiphenyl, 3-vinyl-4'-propylbiphenyl, 4-vinyl-2'-propylbiphenyl, 4-vinyl-3'-propylbiphenyl, 4-vinyl-4'-propylbiphenyl, 1-vinyl-2-propylnaphthalene, 1-vinyl-3-propylnaphthalene, 1-vinyl-4-propylnaphthalene, 1-vinyl-5-propylnaphthalene, 1-vinyl-6-propylnaphthalene, 1-vinyl-7-propylnaphthalene, 1-vinyl-8-propylnaphthalene, 2-vinyl-1-propylnaphthalene, 2-vinyl-3-propylnaphthalene, 2-vinyl-4-propylnaphthalene, 2-vinyl-5-propylnaphthalene, 2-vinyl-6-propylnaphthalene, 2-vinyl-7-propylnaphthalene, and 2-vinyl-8-propylnaphthalene.

Examples of the alkoxy-substituted styrene include o-ethoxystyrene, m-ethoxystyrene, p-ethoxystyrene, o-propoxystyrene, m-propoxystyrene, p-propoxystyrene, o-n-butoxystyrene, m-n-butoxystyrene, p-n-butoxystyrene, o-isobutoxystyrene, m-isobutoxystyrene, p-isobutoxystyrene, o-t-butoxystyrene, m-t-butoxystyrene, p-t-butoxystyrene, o-n-pentoxystyrene, m-n-pentoxystyrene, p-n-pentoxystyrene, α-methyl-o-butoxystyrene, α-methyl-m-butoxystyrene, α-methyl-p-butoxystyrene, o-t-pentoxystyrene, m-t-pentoxystyrene, p-t-pentoxystyrene, o-n-hexoxystyrene, m-n-hexoxystyrene, p-n-hexoxystyrene, α-methyl-o-pentoxystyrene, α-methyl-m-pentoxystyrene, α-methyl-p-pentoxystyrene, o-cyclohexoxystyrene, m-cyclohexoxystyrene, p-cyclohexoxystyrene, o-phenoxystyrene, m-phenoxystyrene, and p-phenoxystyrene.

As the monofunctional aromatic compound, the compounds exemplified above may be used singly or in combination of two or more thereof. Among the compounds exemplified above, styrene and p-ethylvinylbenzene are preferable as the monofunctional aromatic compound.

Examples of the trifunctional aromatic compound in which three carbon-carbon unsaturated double bonds are bonded to an aromatic ring include 1,2,4-trivinylbenzene, 1,3,5-trivinylbenzene, 1,2,4-triisopropenylbenzene, 1,3,5-triisopropenylbenzene, 1,3,5-trivinylnaphthalene, and 3,5,4'-trivinylbiphenyl. As the trifunctional aromatic compound, the compounds exemplified above may be used singly or in combination of two or more thereof.

Examples of the indenes include indene, alkyl-substituted indene, and alkoxyindene. Examples of the alkyl-substituted indene include methylindene, ethylindene, propylindene, butylindene, t-butylindene, sec-butylindene, n-pentylindene, 2-methyl-butylindene, 3-methyl-butylindene, n-hexylindene, 2-methyl-pentylindene, 3-methyl-pentylindene, and 4-methyl-pentylindene. Examples of the alkoxyindene include alkoxyindenes such as methoxyindene, ethoxyindene, propoxyindene, butoxyindene, t-butoxyindene, sec-butoxyindene, n-pentoxyindene, 2-methyl-butoxyindene, 3-methyl-butoxyindene, n-hexoxyindene, 2-methyl-pentoxyindene, 3-methyl-pentoxyindene, and 4-methyl-pentoxyindene. As the indenes, the compounds exemplified above may be used singly or in combination of two or more thereof.

Examples of the acenaphthylenes include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. As the acenaphthylenes, the compounds exemplified above may be used singly or in combination of two or more thereof.

When the aromatic polymer has not only a structural unit derived from the bifunctional aromatic compound but also another structural unit, the aromatic polymer is a copolymer of a structural unit derived from the bifunctional aromatic compound and another structural unit such as a structural unit derived from the monofunctional aromatic compound. This copolymer may be a block copolymer or a random copolymer.

The polymer is not particularly limited as long as it is a polymer having the structural unit represented by Formula (1) in the molecule as described above. It is preferable that the structural unit represented by Formula (1) includes a structural unit represented by the following Formula (2). In other words, the polymer is preferably a polymer having a structural unit represented by the following Formula (2) in the molecule.

[Chem. 3]

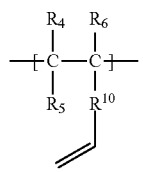

(2)

$R_4$ to $R_6$ in Formula (2) are similar to $R_4$ to $R_6$ in Formula (1). Specifically, $R_4$ to $R_6$ each independently represent a hydrogen atom or an alkyl group having 1 to 6 carbon atoms. $R_7$ represents an arylene group having 6 to 12 carbon atoms.

The arylene group having 6 to 12 carbon atoms in Formula (2) is not particularly limited. Examples of this arylene group include a monocyclic aromatic group such as a phenylene group and a bicyclic aromatic group in which the aromatic is not a monocyclic ring but a bicyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

It is preferable that the structural unit represented by Formula (2) includes a structural unit represented by the following Formula (3). In other words, in the structural unit represented by Formula (2), $R_7$ is preferably a phenylene group. The phenylene group may be any one or two or more of an o-phenylene group, an m-phenylene group, or a p-phenylene group. As the phenylene group, it is preferable to contain a p-phenylene group.

[Chem. 4]

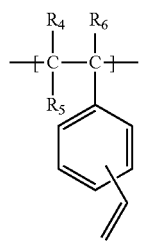

(3)

$R_4$ to $R_6$ in Formula (3) are similar to $R_4$ to $R_6$ in Formula (1). Specifically, $R_4$ to $R_6$ each independently represent a hydrogen atom or an alkyl group having 1 to 6 carbon atoms.

The polymer preferably includes a polymer further having a structural unit represented by the following Formula (4) in the molecule. In other words, it is preferable that the polymer has a structural unit derived from a monofunctional aromatic compound in which one carbon-carbon unsaturated double bond is bonded to an aromatic ring as the structural unit represented by the following Formula (4). Hence, the polymer is preferably a polymer having a structural unit represented by Formula (1) and a structural unit represented by the following Formula (4) in the molecule. In other words, the polymer may have a structural unit other than the structural unit represented by Formula (1) and the structural unit represented by the following Formula (4) (structural unit other than (1) and (4)) as long as it is a polymer having a structural unit represented by Formula (1) and the structural unit represented by the following Formula (4) in the molecule. The polymer may have a structural unit other than (1) and (4), the polymer may be a polymer in which a repeating unit in which the structural unit represented by Formula (1) is repeatedly bonded, a repeating unit in which the structural unit represented by the following Formula (4) is repeatedly bonded, and a repeating unit in which a structural unit other than (1) and (4) is repeatedly bonded are randomly bonded, or the polymer may be a block copolymer or a random copolymer.

[Chem. 5]

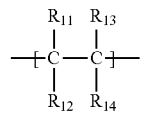

(4)

In Formula (4), $R_8$ to $R_{10}$ are independent of each other. In other words, $R_8$ to $R_{10}$ may be the same group as or different groups from each other. $R_8$ to $R_{10}$ represent a hydrogen atom or an alkyl group having 1 to 6 carbon atoms. $R_{11}$ represents an aryl group.

The alkyl group having 1 to 6 carbon atoms, which is represented by $R_8$ to $R_{10}$, in Formula (4) is not particularly limited and may be similar to the alkyl group having 1 to 6 carbon atoms, which is represented by $R_4$ to $R_6$ in Formula (1). Specific examples of the alkyl group having 1 to 6 carbon atoms, which is represented by $R_8$ to $R_{10}$, in Formula (4) include a methyl group, an ethyl group, a propyl group, and a hexyl group.

The aryl group represented by $R_{11}$ in Formula (4) is not particularly limited, and may be an unsubstituted aryl group or an aryl group in which a hydrogen atom bonded to an aromatic ring is substituted with an alkyl group or the like. The unsubstituted aryl group may be a group obtained by eliminating one hydrogen atom from an aromatic hydrocarbon having one aromatic ring or a group obtained by eliminating one hydrogen atom from an aromatic hydrocarbon having two or more independent aromatic rings (for example, biphenyl). Examples of the aryl group in Formula (4) include an unsubstituted aryl group having 6 to 12 carbon atoms and an arylene group having 6 to 18 carbon atoms in which a hydrogen atom of an aryl group having 6 to 12 carbon atoms is substituted with an alkyl group having 1 to 6 carbon atoms. Examples of the unsubstituted aryl group having 6 to 12 carbon atoms include a phenyl group, a naphthyl group, and a biphenylyl group. Specific examples of the aryl group in Formula (4), namely, $R_{11}$ include the aryl groups presented in the following Tables 1 and 2.

TABLE 1

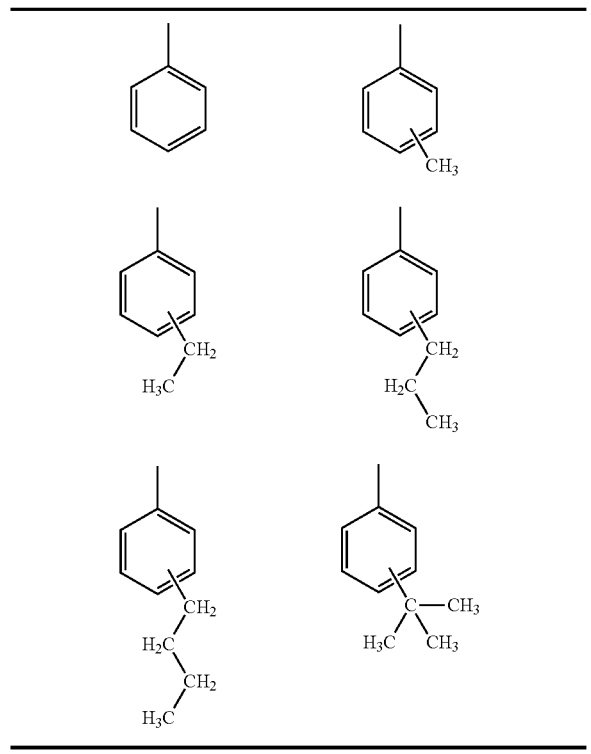

TABLE 2

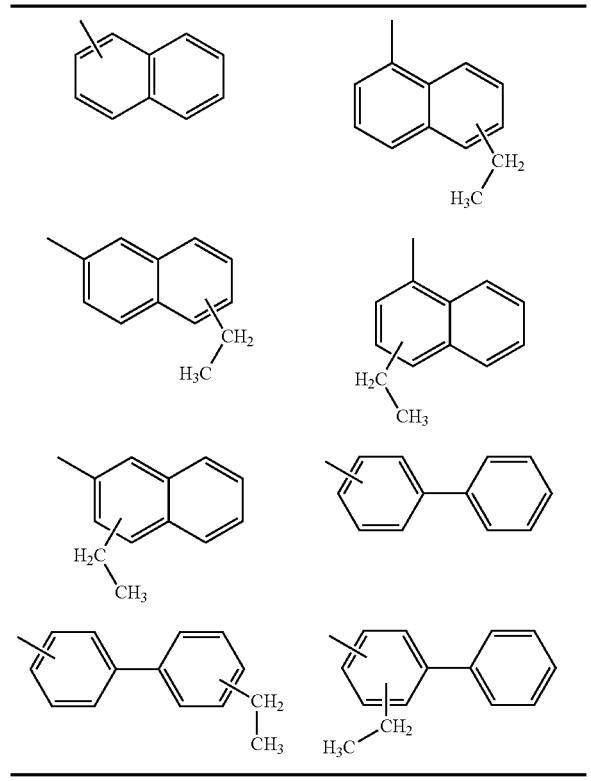

The weight average molecular weight of the polymer is preferably 1,500 to 40,000, more preferably 1,500 to 35,000. When the weight average molecular weight is too low, the heat resistance and the like tend to decrease. When the weight average molecular weight is too high, the moldability and the like tend to decrease. Hence, when the weight average molecular weight of the resin composition is within the above range, excellent heat resistance and moldability are exhibited. Here, the weight average molecular weight is only required to be one measured by general molecular weight measurement, and specific examples thereof include a value measured by gel permeation chromatography (GPC).

In the polymer, when the sum of structural units in the polymer is 100 mol %, the molar content percentage of the structural unit represented by Formula (1) is preferably a molar content percentage within the range of the weight average molecular weight. Specifically, the molar content percentage is preferably 2 to 95 mol %, more preferably 8 to 81 mol %. The molar content percentage of the structural unit represented by Formula (2) and the molar content percentage of the structural unit represented by Formula (3) are similar to the molar content percentage of the structural unit represented by Formula (1). Specifically, the molar content percentages are preferably 2 to 95 mol %, more preferably 8 to 81 mol %. When the polymer is a polymer having a structural unit represented by Formula (1) and a structural unit represented by Formula (4) in the molecule, the molar content percentage of the structural unit represented by Formula (1) is preferably 2 to 95 mol %, more preferably 8 to 81 mol % and the molar content percentage of the structural unit represented by Formula (4) is preferably 5 to 98 mol %, more preferably 19 to 92 mol %.

In the polymer, the average number of structural units represented by Formula (1) is preferably a number within the range of the weight average molecular weight. Specifically, the average number is preferably 1 to 160, more preferably 3 to 140. The average number of structural units represented by Formula (2) and the average number of structural units represented by Formula (3) are similar to the average number of structural units represented by Formula (1). Specifically, the average numbers are preferably 1 to 160, more preferably 3 to 140. When the polymer is a polymer having a structural unit represented by Formula (1) and a structural unit represented by Formula (4) in the molecule, the average number of structural units represented by Formula (1) is preferably 1 to 160, more preferably 3 to 140 and the average number of structural units represented by Formula (4) is preferably 2 to 350, more preferably 4 to 300.

Specific examples of the polymer include a polymer having a structural unit represented by the following Formula (6) in the molecule and further at least one of a structural unit represented by the following Formula (5) and a structural unit represented by the following Formula (7). This polymer may be a block copolymer or a random copolymer.

[Chem. 6]

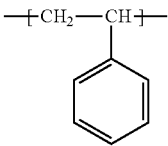

(5)

[Chem. 7]

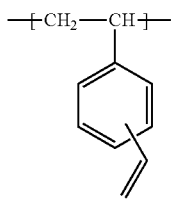

(6)

[Chem. 8]

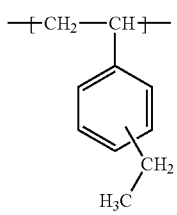

(7)

In the polymer having the structural unit represented by Formula (6) in the molecule and further at least one of the structural unit represented by Formula (5) and the structural unit represented by Formula (7), the molar content percentages of the structural unit represented by Formula (5), the structural unit represented by Formula (6), and the structural unit represented by Formula (7) are preferably 0 to 92 mol %, 8 to 54 mol %, and 0 to 89 mol %, respectively. The average number of structural units represented by Formula (5) is preferably 0 to 350, the average number of structural units represented by Formula (6) is preferably 1 to 160, and the average number of structural units represented by Formula (7) is preferably 0 to 270.

The equivalent of the vinyl group contained in the structural unit represented by Formula (1), where $R_1$ to $R_3$ are each a hydrogen atom, of the polymer is preferably 250 to 1200, more preferably 300 to 1100. When the equivalent is too small, the number of the vinyl groups is too large, the reactivity is too high, and for example, troubles such as the decrease in storage stability of the resin composition or the decrease in fluidity of the resin composition may occur. When a resin composition in which the equivalent is too small is used, for example, molding defects such as generation of voids at the time of multilayer molding may occur by insufficient fluidity and the like and a problem with moldability that a highly reliable wiring board is hardly obtained may occur. When the equivalent is too large, the number of the vinyl groups is too small and the heat resistance of the cured product tends to be insufficient. Hence, when the equivalent is within the above range, excellent heat resistance and moldability are exhibited. The equivalent of the vinyl group contained in the structural unit represented by Formula (1), where $R_1$ to $R_3$ are each a hydrogen atom, is a so-called vinyl equivalent.

The method for producing the polymer is not particularly limited as long as the polymer can be produced. For example, when the polymer is a polymer having the structural units represented by Formulas (5) to (7) in the molecule, examples of the method for producing the polymer include a method in which divinylbenzene, ethylvinylbenzene, and styrene are reacted with one another. Examples of the solvent in this reaction include n-propyl acetate. A catalyst may be used for this reaction, and examples of the catalyst include boron trifluoride-diethyl ether complex.

(Curing Agent)

The resin composition may contain a curing agent. The resin composition may not contain a curing agent but preferably contains a curing agent in the case of a resin composition containing the polymer in order to suitably cure the polymer. The curing agent is not particularly limited as long as it is a curing agent capable of curing the resin composition containing the polymer. Examples of the curing agent include a curing agent having at least one or more functional groups contributing to the reaction with the polymer in the molecule. Examples of the curing agent include styrene, styrene derivatives, a compound having an acryloyl group in the molecule, a compound having a methacryloyl group in the molecule, a compound having a vinyl group in the molecule, a compound having an allyl group in the molecule, a compound having an acenaphthylene structure in the molecule, a compound having a maleimide group in the molecule, and a compound having an isocyanurate group in the molecule.

Examples of the styrene derivatives include bromostyrene and dibromostyrene.

The compound having an acryloyl group in the molecule is an acrylate compound. Examples of the acrylate compound include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The compound having a methacryloyl group in the molecule is a methacrylate compound. Examples of the methacrylate compound include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate (DCP).

The compound having a vinyl group in the molecule is a vinyl compound. Examples of the vinyl compound include a monofunctional vinyl compound (monovinyl compound) having one vinyl group in the molecule and a polyfunctional vinyl compound having two or more vinyl groups in the molecule. Examples of the polyfunctional vinyl compound include divinylbenzene and polybutadiene.

The compound having an allyl group in the molecule is an allyl compound. Examples of the allyl compound include a monofunctional allyl compound having one allyl group in the molecule and a polyfunctional allyl compound having two or more allyl groups in the molecule. Examples of the polyfunctional allyl compound include triallyl isocyanurate compounds such as triallyl isocyanurate (TAIC), diallyl bisphenol compounds, and diallyl phthalate (DAP).

The compound having an acenaphthylene structure in the molecule is an acenaphthylene compound. Examples of the acenaphthylene compound include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

The compound having a maleimide group in the molecule is a maleimide compound. Examples of the maleimide compound include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

The compound having an isocyanurate group in the molecule is an isocyanurate compound. Examples of the isocyanurate compound include a compound having an alkenyl group in the molecule (alkenyl isocyanurate compound), and examples thereof include a trialkenyl isocyanurate compound such as triallyl isocyanurate (TAlC).

The curing agent is not limited to the above-exemplified compounds, but, among the above, for example, styrene, the styrene derivative, the acrylate compound, the methacrylate compound, the vinyl compound, the allyl compound, the maleimide compound, the acenaphthylene compound, and the isocyanate compound are preferable, and the polyfunctional acrylate compound, the polyfunctional methacrylate compound, the polyfunctional vinyl compound, the acenaphthylene compound, and the allyl compound are more preferable. Divinylbenzene is preferable as the polyfunctional vinyl compound. As the acenaphthylene compound, acenaphthylene is preferable. As the allyl compound, an allyl isocyanurate compound having two or more allyl groups in the molecule is preferable, and triallyl isocyanurate (TAIC) is more preferable. As the polyfunctional methacrylate compound, a dimethacrylate compound is preferable, and tricyclodecanedimethanol dimethacrylate (DCP) is more preferable.

As the curing agent, the above curing agents may be used singly or in combination of two or more kinds thereof.

The weight average molecular weight of the curing agent is preferably 100 to 5000, more preferably 100 to 4000, still more preferably 100 to 3000. When the weight average molecular weight of the curing agent is too low, the curing agent may easily volatilize from the compounding component system of the resin composition. When the weight average molecular weight of the curing agent is too high, the viscosity of the varnish of the resin composition and the melt viscosity at the time of heat molding may be too high. Hence, a resin composition imparting superior heat resistance to the cured product is obtained when the weight average molecular weight of the curing agent is within such a range. It is considered that this is because the resin composition containing the polymer can be suitably cured by the reaction of the curing agent with the polymer. The weight average molecular weight here may be measured by a general molecular weight measurement method, and specific examples thereof include a value measured by gel permeation chromatography (GPC).

The average number (number of functional groups) of the functional groups, which contribute to the reaction of the curing agent with the polymer, per one molecule of the curing agent varies depending on the weight average molecular weight of the curing agent but is, for example, preferably 1 to 20, more preferably 2 to 18. When this number of functional groups is too small, sufficient heat resistance of the cured product tends to be hardly attained. When the number of functional groups is too large, the reactivity is too high and, for example, troubles such as a decrease in the storage stability of the resin composition or a decrease in the fluidity of the resin composition may occur.

(Polyphenylene Ether Compound)

The resin composition preferably further contains a polyphenylene ether compound. The polyphenylene ether compound is not particularly limited as long as it has a polyphenylene ether chain in the molecule. Examples of the polyphenylene ether compound include a polyphenylene ether compound having an unsaturated double bond in the molecule.

Examples of the polyphenylene ether compound having an unsaturated double bond in the molecule include a polyphenylene ether compound having a substituent having an unsaturated double bond in the molecule. Examples thereof include polyphenylene ether compounds having a substituent having an unsaturated double bond at the molecular terminal such as a modified polyphenylene ether compound of which the terminal is modified with a substituent having an unsaturated double bond.

The substituent having an unsaturated double bond is not particularly limited. As the substituent, for example, a substituent represented by the following Formula (8) and a substituent represented by the following Formula (9) are preferably used. In other words, the polyphenylene ether compound preferably includes a polyphenylene ether compound having at least one of a group represented by the following Formula (8) and a group represented by the following Formula (9) in the molecule.

[Chem. 9]

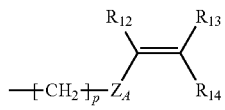

(8)

In Formula (8), p represents an integer 0 to 10. $Z_A$ represents an arylene group. $R_{12}$ to $R_{14}$ are independent of each other. In other words, $R_{12}$ to $R_{14}$ may be the same group as or different groups from each other. $R_{12}$ to $R_{14}$ represent a hydrogen atom or an alkyl group.

In a case where p in Formula (8) is 0, it indicates that $Z_A$ is directly bonded to the terminal of polyphenylene ether.

This arylene group is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group. In addition, the alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

[Chem. 10]

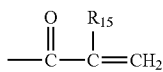

(9)

In Formula (9), $R_{15}$ represents a hydrogen atom or an alkyl group. The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

Preferred specific examples of the substituent represented by Formula (8) include, for example, a substituent having a vinylbenzyl group. Examples of the substituent having a vinylbenzyl group include a substituent represented by the following Formula (10). Examples of the substituent represented by Formula (9) include an acrylate group and a methacrylate group.

[Chem. 11]

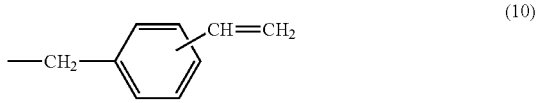

(10)

More specific examples of the substituent include a vinylbenzyl group (ethenylbenzyl group), a vinylphenyl group, an acrylate group, and a methacrylate group. The vinylbenzyl group may be any one or two or more of an o-ethenylbenzyl group, an m-ethenylbenzyl group, or a p-ethenylbenzyl group.

The polyphenylene ether compound has a polyphenylene ether chain in the molecule and preferably has, for example, a repeating unit represented by the following Formula (11) in the molecule.

[Chem. 12]

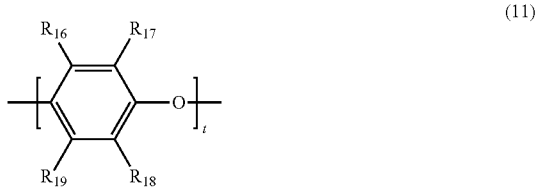

(11)

In Formula (11), t represents 1 to 50. $R_{16}$ to $R_{19}$ are independent of each other. In other words, $R_{16}$ to $R_{19}$ may be the same group as or different groups from each other. $R_{16}$ to $R_{19}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_{16}$ to $R_{19}$ include the following.

The alkyl group is not particularly limited and is, for example, preferably an alkyl group having 1 to 18 carbon atoms and more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms and more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms and more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms and more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms and more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms and more preferably an alkynylcarbonyl group having 3 to 10 carbon atoms. Specific examples thereof include a propioloyl group.

The weight average molecular weight (Mw) of the polyphenylene ether compound is not particularly limited. Specifically, the weight average molecular weight is preferably 500 to 5000, more preferably 800 to 4000, and still more preferably 1000 to 3000. The weight average molecular weight here may be measured by a general molecular weight measurement method, and specific examples thereof include a value measured by gel permeation chromatography (GPC). In a case where the polyphenylene ether compound has a repeating unit represented by Formula (11) in the molecule, t is preferably a numerical value so that the weight average molecular weight of the polyphenylene ether compound is in such a range. Specifically, t is preferably 1 to 50.

When the weight average molecular weight of the polyphenylene ether compound is in such a range, the polyphenylene ether compound exhibits the excellent low dielectric properties of polyphenylene ether and not only imparts superior heat resistance to the cured product but also exhibits excellent moldability. This is considered to be due to the following. When the weight average molecular weight of ordinary polyphenylene ether is in such a range, the heat resistance of the cured product tends to decrease since the molecular weight is relatively low. With regard to this point, since the polyphenylene ether compound according to the present embodiment has one or more unsaturated double bonds at the terminal, it is considered that a cured product exhibiting sufficiently high heat resistance is obtained. When the weight average molecular weight of the polyphenylene ether compound is in such a range, the polyphenylene ether compound has a relatively low molecular weight and is thus considered to exhibit excellent moldability. Hence, it is considered that such a polyphenylene ether compound not only imparts superior heat resistance to the cured product but also exhibits excellent moldability.

In the polyphenylene ether compound, the average number of the substituents (number of terminal functional groups) at the molecule terminal per one molecule of the polyphenylene ether compound is not particularly limited. Specifically, the average number is preferably 1 to 5, more preferably 1 to 3, and still more preferably 1.5 to 3. When the number of terminal functional groups is too small, sufficient heat resistance of the cured product tends to be hardly attained. When the number of terminal functional groups is too large, the reactivity is too high and, for example, there is a possibility that troubles such as a decrease in storage stability of the resin composition and a decrease in fluidity of the resin composition may occur. In other words, when such polyphenylene ether is used, for example, molding defects such as generation of voids at the time of multilayer molding occur by insufficient fluidity and the like and a problem of moldability that a highly reliable printed wiring board is hardly obtained may occur.

The number of terminal functional groups in the polyphenylene ether compound includes a numerical value expressing the average value of the substituents per one molecule of all the polyphenylene ether compounds present in 1 mole of the polyphenylene ether compound. This number of terminal functional groups can be determined, for example, by measuring the number of hydroxyl groups remaining in the obtained polyphenylene ether compound and calculating the number of hydroxyl groups decreased from the number of hydroxyl groups in the polyphenylene ether before being modified. The number of hydroxyl groups decreased from the number of hydroxyl groups in the polyphenylene ether before being modified is the number of terminal functional groups. Moreover, with regard to the method for measuring the number of hydroxyl groups remaining in the polyphenylene ether compound, the number of hydroxyl groups can be determined by adding a quaternary ammonium salt (tetraethylammonium hydroxide) to be associated with a hydroxyl group to a solution of the polyphenylene ether compound and measuring the UV absorbance of the mixed solution.

The intrinsic viscosity of the polyphenylene ether compound is not particularly limited. Specifically, the intrinsic viscosity may be 0.03 to 0.12 dl/g, and is preferably 0.04 to 0.11 dl/g and more preferably 0.06 to 0.095 dl/g. When the intrinsic viscosity is too low, the molecular weight tends to be low and low dielectric properties such as a low dielectric constant and a low dielectric loss tangent tend to be hardly attained. When the intrinsic viscosity is too high, the viscosity is high, sufficient fluidity is not attained, and the moldability of the cured product tends to decrease. Hence, when the intrinsic viscosity of the polyphenylene ether compound is in the above range, excellent heat resistance and moldability of the cured product can be realized.

Note that the intrinsic viscosity here is an intrinsic viscosity measured in methylene chloride at 25° C. and more specifically is, for example, a value attained by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

Examples of the polyphenylene ether compound include a modified polyphenylene ether compound represented by the following Formula (12) and a modified polyphenylene ether compound represented by the following Formula (13). As the polyphenylene ether compound, these modified polyphenylene ether compounds may be used singly or two kinds of these modified polyphenylene ether compounds may be used in combination.

[Chem. 13]

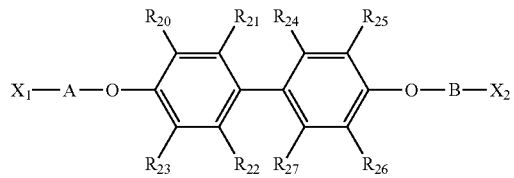

(12)

[Chem. 14]

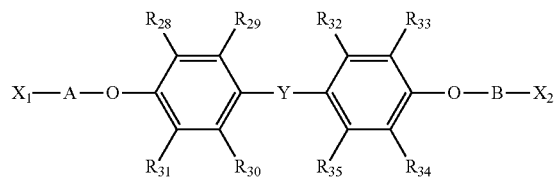

(13)

In Formulas (12) and (13), $R_{20}$ to $R_{27}$ and $R_{28}$ to $R_{35}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ each independently represent a substituent having a carbon-carbon unsaturated double bond. A and B represent a repeating unit represented by the following Formula (14) and a repeating unit represented by the following Formula (15), respectively. In Formula (13), Y represents a linear, branched, or cyclic hydrocarbon having 20 or less carbon atoms.

[Chem. 15]

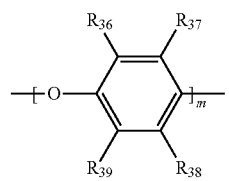

(14)

[Chem. 16]

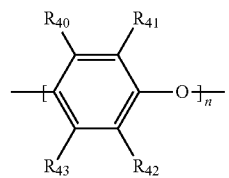

(15)

In Formulas (14) and (15), m and n each represent 0 to 20. $R_{36}$ to $R_{39}$ and $R_{40}$ to $R_{43}$ each independently represent a hydrogen atom, an alkyl group, an alkenyl group, an alkynyl group, a formyl group, an alkylcarbonyl group, an alkenylcarbonyl group, or an alkynylcarbonyl group.

The modified polyphenylene ether compound represented by Formula (12) and the modified polyphenylene ether compound represented by Formula (13) are not particularly limited as long as they satisfy the above configuration. Specifically, in Formulas (12) and (13), $R_{20}$ to $R_{27}$ and $R_{25}$ to $R_{35}$ are independent of each other as described above. In other words, $R_{20}$ to $R_{27}$ and $R_{28}$ to $R_{35}$ may be the same group as or different groups from each other. $R_{20}$ to $R_{27}$ and $R_{28}$ to $R_{35}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

In Formulas (14) and (15), m and n each preferably represent 0 to 20 as described above. In addition, it is preferable that m and n represent numerical values so that the sum of m and n is 1 to 30. Hence, it is more preferable that m represents 0 to 20, n represents 0 to 20, and the sum of m and n represents 1 to 30. $R_{36}$ to $R_{39}$ and $R_{40}$ to $R_{43}$ are independent of each other. In other words, $R_{36}$ to $R_{39}$ and $R_{40}$ to $R_{43}$ may be the same group as or different groups from each other. $R_{36}$ to $R_{39}$ and $R_{40}$ to $R_{43}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_{20}$ to $R_{43}$ are the same as $R_{16}$ to $R_{19}$ in Formula (11).

In Formula (13), Y represents a linear, branched, or cyclic hydrocarbon having 20 or less carbon atoms as described above. Examples of Y include a group represented by the following Formula (16).

[Chem. 17]

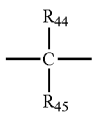

(16)

In Formula (16), $R_{44}$ and $R_{45}$ each independently represent a hydrogen atom or an alkyl group. Examples of the alkyl group include a methyl group. Examples of the group represented by Formula (16) include a methylene group, a methylmethylene group, and a dimethylmethylene group. Among these, a dimethylmethylene group is preferable.

In Formulas (12) and (13), $X_1$ and $X_2$ each independently represent a substituent having a carbon-carbon unsaturated double bond. The substituents $X_1$ and $X_2$ are not particularly limited as long as they are substituents having a carbon-carbon unsaturated double bond. Examples of the substituents $X_1$ and $X_2$ include a substituent represented by Formula (8). In the modified polyphenylene ether compound represented by Formula (12) and the modified polyphenylene ether compound represented by Formula (13), $X_1$ and $X_2$ may be the same substituent as or different substituents from each other.

More specific examples of the modified polyphenylene ether compound represented by Formula (12) include a modified polyphenylene ether compound represented by the following Formula (17).

[Chem. 18]

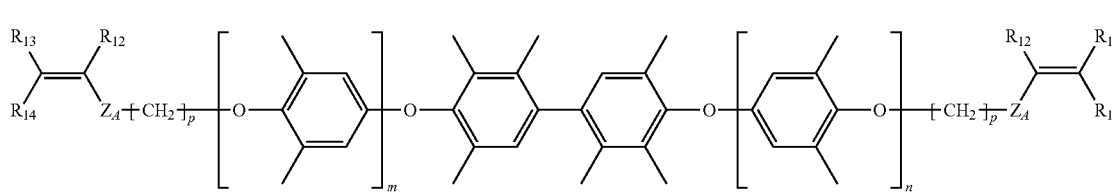

(17)

More specific examples of the modified polyphenylene ether compound represented by Formula (13) include a modified polyphenylene ether compound represented by the following Formula (18) and a modified polyphenylene ether compound represented by the following Formula (19).

[Chem. 19]

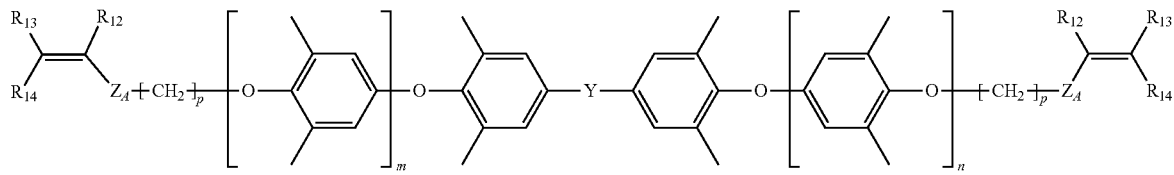

(18)

[Chem. 20]

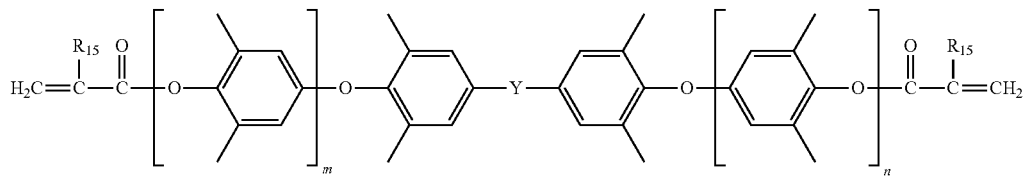

(19)

In Formulas (17) to (19), m and n are the same as m and n in Formulas (14) and (15). In Formulas (17) and (18), R12 to R14, p, and ZA are the same as R12 to R14, p, and ZA in Formula (8). In Formulas (18) and (19), Y is the same as Y in the above Formula (13). In Formula (19), R15 is the same as R15 in Formula (9).

In the modified polyphenylene ether compound, the average number of the substituents at the molecular terminal (the number of terminal functional groups) per one molecule of the modified polyphenylene ether compound includes the range described above, but specifically is preferably 1 to 2, more preferably 1.5 to 2, for example, in the case of the modified polyphenylene ether compounds represented by Formulas (17) to (19).

The method for synthesizing the modified polyphenylene ether compound used in the present embodiment is not particularly limited as long as a modified polyphenylene ether compound of which the terminal is modified with a substituent having a carbon-carbon unsaturated double bond can be synthesized. Specific examples thereof include a method in which polyphenylene ether is reacted with a compound in which a substituent having a carbon-carbon unsaturated double bond is bonded to a halogen atom.

Examples of the compound in which a substituent having a carbon-carbon unsaturated double bond is bonded to a halogen atom include compounds in which substituents represented by Formulas (8) to (10) are bonded to a halogen atom. Specific examples of the halogen atom include a chlorine atom, a bromine atom, an iodine atom, and a fluorine atom. Among these, a chlorine atom is preferable. More specific examples of the compound in which a substituent having a carbon-carbon unsaturated double bond is bonded to a halogen atom include p-chloromethylstyrene and m-chloromethylstyrene.

Polyphenylene ether which is a raw material is not particularly limited as long as a predetermined modified polyphenylene ether compound can be finally synthesized. Specific examples thereof include those containing polyphenylene ether composed of 2,6-dimethylphenol and at least one of a bifunctional phenol and a trifunctional phenol and polyphenylene ether such as poly(2,6-dimethyl-1,4-phenylene oxide) as a main component. The bifunctional phenol is a phenol compound having two phenolic hydroxyl groups in the molecule, and examples thereof include tetramethyl bisphenol A. The trifunctional phenol is a phenol compound having three phenolic hydroxyl groups in the molecule.

Examples of the method for synthesizing the modified polyphenylene ether compound include the methods described above. Specifically, polyphenylene ether as described above and a compound in which a substituent having a carbon-carbon unsaturated double bond is bonded to a halogen atom are dissolved in a solvent and stirred. By doing so, polyphenylene ether reacts with the compound in which a substituent having a carbon-carbon unsaturated double bond is bonded to a halogen atom, and the modified polyphenylene ether compound used in the present embodiment is obtained.

The reaction is preferably conducted in the presence of an alkali metal hydroxide. By doing so, it is considered that this reaction suitably proceeds. This is considered to be because the alkali metal hydroxide functions as a dehydrohalogenating agent, specifically, a dehydrochlorinating agent. In other words, it is considered that the alkali metal hydroxide eliminates the hydrogen halide from the phenol group in polyphenylene ether and the compound in which a substituent having a carbon-carbon unsaturated double bond is bonded to a halogen atom, and by doing so, the substituent having a carbon-carbon unsaturated double bond is bonded to the oxygen atom of the phenol group instead of the hydrogen atom of the phenol group in the polyphenylene ether.

The alkali metal hydroxide is not particularly limited as long as it can act as a dehalogenating agent, and examples thereof include sodium hydroxide. The alkali metal hydroxide is usually used in the form of an aqueous solution and is specifically used as an aqueous sodium hydroxide solution.

The reaction conditions such as reaction time and reaction temperature also vary depending on the compound in which a substituent having a carbon-carbon unsaturated double bond is bonded to a halogen atom and the like, and are not particularly limited as long as they are conditions under which the reaction as described above suitably proceeds. Specifically, the reaction temperature is preferably room temperature to 100° C. and more preferably 30° C. to 100° C. In addition, the reaction time is preferably 0.5 to 20 hours and more preferably 0.5 to 10 hours.

The solvent used at the time of the reaction is not particularly limited as long as it can dissolve polyphenylene ether and the compound in which a substituent having a carbon-carbon unsaturated double bond is bonded to a halogen atom, and does not inhibit the reaction of polyphenylene ether with the compound in which a substituent having a carbon-carbon unsaturated double bond is bonded to a halogen atom. Specific examples thereof include toluene.

The above reaction is preferably conducted in the presence of not only an alkali metal hydroxide but also a phase transfer catalyst. In other words, the above reaction is preferably conducted in the presence of an alkali metal hydroxide and a phase transfer catalyst. By doing so, it is considered that the above reaction more suitably proceeds. This is considered to be due to the following. This is considered to be because the phase transfer catalyst is a catalyst which has a function of taking in the alkali metal hydroxide, is soluble in both phases of a phase of a polar solvent such as water and a phase of a non-polar solvent such as an organic solvent, and can transfer between these phases. Specifically, in a case where an aqueous sodium hydroxide solution is used as an alkali metal hydroxide and an organic solvent, such as toluene, which is incompatible with water is used as a solvent, it is considered that even when the aqueous sodium hydroxide solution is dropped into the solvent subjected to the reaction, the solvent and the aqueous sodium hydroxide solution are separated from each other and the sodium hydroxide is hardly transferred to the solvent. In that case, it is considered that the aqueous sodium hydroxide solution added as an alkali metal hydroxide hardly contributes to the promotion of the reaction. In contrast, when the reaction is conducted in the presence of an alkali metal hydroxide and a phase transfer catalyst, it is considered that the alkali metal hydroxide is transferred to the solvent in the state of being taken in the phase transfer catalyst and the aqueous sodium hydroxide solution is likely to contribute to the promotion of the reaction. For this reason, when the reaction is conducted in the presence of an alkali metal hydroxide and a phase transfer catalyst, it is considered that the above reaction more suitably proceeds.

The phase transfer catalyst is not particularly limited, and examples thereof include quaternary ammonium salts such as tetra-n-butylammonium bromide.

The resin composition to be used in the present embodiment preferably contains a modified polyphenylene ether compound obtained as described above as the polyphenylene ether compound.

(Content)

The content of the polymer is preferably 40 to 90 parts by mass, more preferably 50 to 90 parts by mass with respect to 100 parts by mass of the sum of the polymer and the curing agent. In other words, the polymer is preferably 40% to 90% by mass with respect to the total mass of the polymer and the curing agent. When the polyphenylene ether compound is contained in the resin composition, the content of the polymer is preferably 40 to 90 parts by mass with respect to 100 parts by mass of the sum of the polymer, the curing agent, and the polyphenylene ether compound. In other words, the polymer is preferably 40% to 90% by mass with respect to the total mass of the polymer, the curing agent, and the polyphenylene ether compound. The content of the curing agent is preferably 10 to 60 parts by mass, more preferably 10 to 50 parts by mass with respect to 100 parts by mass of the sum of the polymer and the curing agent. In other words, the content ratio of the polymer to the curing agent is preferably 90:10 to 40:60, more preferably 90:10 to 50:50 in terms of mass ratio. When the respective contents of the polymer and the curing agent are contents so as to satisfy the above ratio, a resin composition imparting superior heat resistance to the cured product is obtained. It is considered that this is because the curing reaction between the polymer and the curing agent suitably proceeds. The polyphenylene ether compound may be contained in the resin composition, and in that case, the content of the polyphenylene ether compound is preferably 1 to 30 parts by mass, more preferably 5 to 10 parts by mass with respect to 100 parts by mass of the sum of the polymer, the curing agent, and the polyphenylene ether compound.

(Other Components)

The resin composition according to the present embodiment may contain components (other components) other than the polymer, the curing agent, and the polyphenylene ether compound if necessary in a range in which the effects of the present invention are not impaired. As other components contained in the resin composition according to the present embodiment, for example, additives such as a silane coupling agent, a flame retardant, an initiator, an antifoaming agent, an antioxidant, a heat stabilizer, an antistatic agent, an ultraviolet absorber, a dye or pigment, a lubricant, and an inorganic filler may be further contained. In addition to the polymer, the curing agent, and the polyphenylene ether compound, the resin composition may contain a thermosetting resin such as an epoxy resin.

As described above, the resin composition according to the present embodiment may contain a silane coupling agent. The silane coupling agent may be contained not only in the resin composition but also as a silane coupling agent covered on the inorganic filler contained in the resin composition for surface treatment in advance, or as a silane coupling agent covered on the fibrous base material for surface treatment in advance. The silane coupling agent will be described later.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the decrease in heat resistance can be suppressed by the use of a halogen-based flame retardant. In the field of being required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the flame retardants exemplified may be used singly or in combination of two or more kinds thereof.

As described above, the resin composition according to the present embodiment may contain an initiator (reaction initiator). Even when the resin composition contains only the polymer and the curing agent, the curing reaction may proceed. Even when the resin composition contains only the polymer, the curing reaction may proceed. However, a reaction initiator may be added since there is a case where it is difficult to raise the temperature until curing proceeds depending on the process conditions. The reaction initiator is not particularly limited as long as it can promote the curing reaction between the polymer and the curing agent. Specific examples thereof include oxidizing agents such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. Moreover, a metal carboxylate can be concurrently used if necessary. By doing so, the curing reaction can be further promoted. Among these, α,α'-bis(t-butylperoxy-m-isopropyl)benzene is preferably used. α,α'-bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in the storage stability of the polyphenylene ether resin composition. Furthermore, α,α'-bis(t-butylperoxy-m-isopropyl)benzene exhibits low volatility, thus does not volatilize at the time of prepreg drying and storage, and exhibits favorable stability. The reaction initiators may be used singly or in combination of two or more kinds thereof.

The content of the initiator is not particularly limited, but is, for example, preferably 0.1 to 1.8 parts by mass, more preferably 0.1 to 1.5 parts by mass, still more preferably 0.3 to 1.5 parts by mass with respect to 100 parts by mass of the total mass of the polymer, the curing agent, and the polyphenylene ether compound. When the content of the initiator is too low, the curing reaction between the polymer and the curing agent tends not to start suitably. When the content of the initiator is too high, the dielectric loss tangent of the cured product of the obtained prepreg becomes large and excellent low dielectric properties tend to be hardly exhibited. Hence, when the content of the initiator is within the above range, a cured product of a prepreg exhibiting excellent low dielectric properties is obtained.

As described above, the resin composition according to the present embodiment may contain a filler such as an inorganic filler. Examples of the filler include those to be added to enhance the heat resistance and flame retardancy of a cured product of the resin composition, but the filler is not particularly limited. The heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable and spherical silica is more preferable among these. The filler may be used singly or in combination of two or more kinds thereof. The filler may be used as it is, or a filler of which the surface is treated with a silane coupling agent may be used. Examples of this silane coupling agent include silane coupling agents having functional groups such as an amino group, a vinyl group, a styryl group, a methacryloxy group, and an acryloxy group in the molecule. In other words, examples of this silane coupling agent include compounds having at least one of an amino group, a methacryloxy group, a styryl group, a vinyl group, or an acryloxy group as a reactive functional group, and further a hydrolyzable group such as a methoxy group or an ethoxy group. The silane coupling agent is not particularly limited, and examples thereof include the following silane coupling agents. Examples of the silane coupling agent having an amino group in the molecule include N-(2-aminoethyl)-3-aminopropylmethyldimethoxysilane, N-(2-aminoethyl)-3-aminopropylmethyldiethoxysilane, 1-aminopropyltrimethoxysilane, 2-aminopropyltrimethoxysilane, 3-aminopropyltrimethoxysilane, 1,2-diaminopropyltrimethoxysilane, 3-amino-1-propenyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, 3-(N-phenyl)aminopropyltrimethoxysilane, N-(2-aminoethyl)-3-aminopropylethyldiethoxysilane, N-(2-aminoethyl)-3-aminopropyltriethoxysilane, 3-(N-styrylmethyl-2-aminoethylamino)propyltrimethoxysilane, bis(2-hydroxyethyl)-3-aminopropyltriethoxysilane, N-methylaminopropyltrimethoxysilane, N-(3-acryloxy-2-hydroxypropyl)-3-aminopropyltriethoxysilane, 4-aminobutyltriethoxysilane, (aminoethylaminomethyl)phenetyltrimethoxysilane, N-(2-aminoethyl-3-aminopropyl)tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxyethoxy)silane, 3-aminopropyltriethoxysilane, 3-aminopropyltrimethoxysilane, ω-aminoundecyltrimethoxysilane, 3-(2-N-benzylaminoethylaminopropyl)trimethoxysilane, bis(2-hydroxyethyl)-3-aminopropyltrimethoxysilane, (N,N-diethyl-3-aminopropyl)trimethoxysilane, (N,N-dimethyl-3-aminopropyl)trimethoxysilane, N-methylaminopropyltrimethoxysilane, N-phenylaminopropyltriethoxysilane, and 3-(N-styrylmethyl-2-aminoethylamino)propyltriethoxysilane. Examples of a silane coupling agent having a methacryloxy group in the molecule include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane. Examples of a silane coupling agent having a styryl group in the molecule include p-styryltrimethoxysilane and p-styryltriethoxysilane. Examples of a silane coupling agent having a vinyl group in the molecule include vinyltriethoxysilane and vinyltrimethoxysilane. Examples of a silane coupling agent having an acryloxy group in the molecule include 3-acryloxypropyltrimethoxysilane and 3-acryloxypropyltriethoxysilane. The filler may be an inorganic filler in which a molybdenum compound exists at least at a part of the surface. To "exist on the surface" refers to a state in which a molybdenum compound is supported on at least a part of the surface of the inorganic filler (inorganic substance) other than the molybdenum compound, and a state in which at least a part of the surface of the inorganic filler (inorganic substance) other than the molybdenum compound is covered with the molybdenum compound. Examples of the molybdenum compound include molybdenum compounds that can be used as an inorganic filler, and more specific examples thereof include zinc molybdate, calcium molybdate, and magnesium molybdate. The molybdenum compounds may be used singly or in combination of two or more kinds thereof.

The content of the inorganic filler is preferably 30 to 280 parts by mass, more preferably 50 to 280 parts by mass, still more preferably 50 to 250 parts by mass with respect to 100 parts by mass of the total mass of the polymer, the curing agent, and the polyphenylene ether compound. When the content of the inorganic filler is too low, the effect exerted by the inorganic filler becomes insufficient, and for example, heat resistance and flame retardancy tend not to be sufficiently enhanced. When the content of the inorganic filler is too high, the dielectric constants of the cured product of the resin composition and the cured product of the prepreg tend to be high and excellent low dielectric properties tend to be hardly exhibited. Hence, when the content of the inorganic filler is within the above range, a cured product of the prepreg exhibiting excellent low dielectric properties is obtained.

(Copper Foil)

The copper foil is not particularly limited as long as it is a copper foil in which the exposed surface has the chromium element amount and surface roughness as described above when the copper-clad laminate is etched with a copper chloride solution. Specifically, the copper foil is not particularly limited as long as it is a copper foil in which the chromium element amount on the exposed surface measured by XPS is 7.5 at % or less with respect to the total element amount measured by XPS and the surface roughness of the exposed surface is 2.0 μm or less in terms of ten-point average roughness. The etching treatment of the copper-clad laminate when the exposed surface is formed is an etching treatment using a copper chloride solution and is a treatment for removing the copper foil. Specifically, the etching treatment is a treatment for removing the copper foil by performing etching using a cupric chloride solution at a temperature of this solution of 45° C. for 90 seconds (for example, in a case where the thickness of the copper foil is 18 μm) and then performing water washing using city water or pure water at room temperature.

The chromium element amount on the exposed surface measured by XPS is 7.5 at % or less as described above, preferably 7.0 at % or less, more preferably 6.5 at % or less with respect to the total element amount measured by XPS. When this chromium element amount is too large, the interlayer adhesive property decreases, delamination is likely to occur when the obtained copper-clad laminate is heated, and the heat resistance tends to decrease. For this reason, it is more preferable as the chromium element amount is smaller, but the limit thereof is about 0.1 at % in reality. From this fact, the chromium element amount is preferably 0.1 to 7.5 at %.

The chromium element amount can be measured by general X-ray photoelectron spectroscopy as XPS. Specifically, the chromium element amount can be measured by irradiating the sample with X-rays in a vacuum using PHI 5000 Versaprobe manufactured by ULVAC-PHI, INCORPORATED.

It is preferable that a nitrogen element that can be confirmed by XPS exists on the exposed surface. The term "nitrogen element that can be confirmed by XPS" means that the nitrogen element amount is an amount equal to or more than the detection limit by XPS, specifically, 0.1 at % or more. The nitrogen element amount on the exposed surface measured by XPS is preferably 1.0 at % or more, more preferably 2.5 at % or more, still more preferably 3.5 at % or more with respect to the total element amount measured by XPS.

The present inventors have found out that delamination is less likely to occur even when the obtained wiring board is heated when a nitrogen element that can be confirmed by XPS exists on the exposed surface. The present inventors have presumed that delamination is likely to occur at the time of heating when a compound containing a chromium element exists as an etching residue as described above. On the other hand, when a compound containing a nitrogen element as an etching residue exists in an amount that can be confirmed by X-ray photoelectron spectroscopy, it is considered that the compound containing a nitrogen element also exists in a certain amount or more on the surface of the insulating layer existing between the wirings in a wiring board manufactured from the copper-clad laminate. It is considered that the interlayer adhesive property between the insulating layers is enhanced and delamination is less likely to occur by this compound containing a nitrogen element. From this fact, it is considered that a copper-clad laminate is obtained from which a wiring board exhibiting higher heat resistance can be suitably manufactured. From this fact, when the nitrogen element amount is too small, there is a tendency that the effect of suppressing the occurrence of delamination by the existence of nitrogen element cannot be sufficiently exerted. It is more preferable as the nitrogen element amount is larger, but the limit thereof is about 5.0 at % in reality. From this fact, the nitrogen element amount is preferably 1.0 to 5.0 at %.

The nitrogen element is preferably derived from a nitrogen atom contained in a compound having an amino group and is more preferably derived from a nitrogen atom contained in a silane coupling agent having an amino group. The fact that the nitrogen element is derived from the nitrogen atom contained in a compound having an amino group is considered to mean that a compound containing a nitrogen element which exists as an etching residue is a compound having an amino group. Specifically, such a copper foil is considered to be a copper foil having a layer treated with a silane coupling agent having an amino group in the molecule as a silane coupling agent layer described later. It is considered that this compound having an amino group, namely, a silane coupling agent having an amino group in the molecule more effectively exerts the effect of enhancing the interlayer adhesive property between the insulating layers and diminishing the occurrence of delamination. From this fact, it is considered that a copper-clad laminate is obtained from which a wiring board exhibiting higher heat resistance can be suitably manufactured.

One or more selected from a copper (Cu) element, a carbon (C) element, an oxygen (O) element, a silicon (Si) element, a nickel (Ni) element, a zinc (Zn) element, a cobalt (Co) element or the like may exist on the exposed surface as elements that can be confirmed by XPS, in addition to a chromium (Cr) element and a nitrogen (N) element. The amount of each of these elements is, for example, preferably 0 to 90 at %, more preferably 0 to 80 at %, still more preferably 0 to 70 at % with respect to the total element amount measured by XPS.

Specific examples of the copper foil include copper foil obtained by subjecting a copper foil base material to various treatments. The treatment is not particularly limited as long as it is a treatment applied to a copper foil used in a copper-clad laminate. Examples of the treatment include a roughening treatment, a heat resistance treatment, a rust prevention treatment, and a silane coupling agent treatment. The copper foil may be one that has been subjected to any one treatment or one that has been subjected to the combination of two or more treatments. In a case where two or more of the treatments are performed, it is preferable to perform the roughening treatment, the heat resistance treatment, the rust prevention treatment, and the silane coupling agent treatment in this order.

The copper foil base material may contain copper, and examples thereof include a foil-like base material formed of copper or a copper alloy. Examples of the copper alloy include alloys containing copper and at least one selected from the group consisting of nickel, phosphorus, tungsten, arsenic, molybdenum, chromium, cobalt, and zinc.

The roughening treatment is not particularly limited and may be a roughening treatment generally performed when a copper foil is manufactured, but examples thereof include a treatment for forming roughening particles on the surface of the copper foil base material or the like that is an object to be treated. By this roughening treatment, the surface of the copper foil is covered with roughening particles containing copper or a copper alloy. The region where these roughening particles exist is also called a roughened layer. The copper foil may have a layer (roughened layer) formed by the roughening treatment.

The heat resistance treatment is not particularly limited and may be a heat resistance treatment generally performed when a copper foil is manufactured, but examples thereof include a treatment for forming a heat resistant layer containing a simple substance or an alloy of nickel, cobalt, copper, or zinc. The region formed by this heat resistance treatment is also called a heat resistant layer even if the region does not have a complete layer shape. The copper foil may have a layer (heat resistant layer) formed by the heat resistance treatment.

The rust prevention treatment is not particularly limited, and may be a rust prevention treatment generally performed when a copper foil is manufactured, but is preferably a treatment for forming a rust preventive layer containing nickel. Examples of the rust prevention treatment include a chromate treatment. The region formed by this rust prevention treatment is also called a rust preventive layer even if the region does not have a complete layer shape. The copper foil may have a layer (rust preventive layer) formed by the rust prevention treatment.

The silane coupling agent treatment is not particularly limited and may be a silane coupling agent treatment generally performed when a copper foil is manufactured, but examples thereof include a treatment for applying a silane coupling agent to the surface of the copper foil or the like that is an object to be treated. As the silane coupling agent treatment, the silane coupling agent may be dried or heated after being applied. By treating the copper foil with a silane coupling agent, the alkoxy group of the silane coupling agent reacts and bonds with copper or the like constituting the copper foil that is an object to be treated. The region formed by this bonded silane coupling agent is a silane coupling agent layer. The copper foil may have a layer (silane coupling agent layer) formed by the silane coupling agent treatment.

Specific examples of the copper foil include a copper foil including a copper foil base material and a coating layer disposed on the copper foil base material. Examples of the coating layer include a roughened layer, a heat resistant layer, a rust preventive layer, and a silane coupling agent layer. In the copper foil, these layers may be provided singly or two or more of these layers may be provided by being laminated as the coating layer. In a case where the coating layer is formed of a plurality of layers, it is preferable to provide the copper foil base material, the roughened layer, the heat resistant layer, the rust preventive layer, and the silane coupling agent layer in this order.

Examples of the roughened layer include a layer containing roughening particles containing copper or a copper alloy. The copper alloy is the same as the copper alloy in the copper foil base material. The roughened layer is obtained by, for example, subjecting the copper foil base material to a roughening treatment. Examples of the roughened layer include a layer in which roughening particles obtained by subjecting the copper foil base material to a roughening treatment are formed and then particles containing simple substances or alloys of nickel, cobalt, copper, zinc and the like are formed as secondary particles and tertiary particles. In other words, examples of the roughened layer include a layer which contains not only the roughening particles but also particles containing simple substances or alloys of nickel, cobalt, copper, zinc and the like.

Examples of the heat resistant layer include layers containing simple substances or alloys of nickel, cobalt, copper, zinc and the like. The heat resistant layer may be a single layer or two or more layers. Examples of the heat resistant layer include a layer in which a nickel layer and a zinc layer are laminated.

Examples of the rust preventive layer include a layer containing chromium such as a chromate treated layer. The rust preventive layer is obtained by, for example, subjecting a copper foil base material provided with the heat resistant layer and the like to chromate treatment.

The silane coupling agent layer is a layer obtained by performing a treatment with a silane coupling agent. Examples thereof include a layer obtained by treating a copper foil base material provided with the rust preventive layer and the like with a silane coupling agent.

Examples of the silane coupling agent include a silane coupling agent having an amino group in the molecule and a silane coupling agent having a carbon-carbon unsaturated double bond in the molecule.

Examples of the silane coupling agent having an amino group in the molecule include compounds having an amino group as a reactive functional group, and further a hydrolyzable group such as a methoxy group or an ethoxy group. Specific examples of the silane coupling agent having an amino group in the molecule include N-(2-aminoethyl)-3-aminopropylmethyldimethoxysilane, N-(2-aminoethyl)-3-aminopropylmethyldiethoxysilane, 1-aminopropyltrimethoxysilane, 2-aminopropyltrimethoxysilane, 3-aminopropyltrimethoxysilane, 1,2-diaminopropyltrimethoxysilane, 3-amino-1-propenyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, 3-(N-phenyl)aminopropyltrimethoxysilane, N-(2-aminoethyl)-3-aminopropylethyldiethoxysilane, N-(2-aminoethyl)-3-aminopropyltriethoxysilane, 3-(N-styrylmethyl-2-aminoethylamino)propyltrimethoxysilane, bis(2-hydroxyethyl)-3-aminopropyltriethoxysilane, N-methylaminopropyltrimethoxysilane, N-(3-acryloxy-2-hydroxypropyl)-3-aminopropyltriethoxysilane, 4-aminobutyltriethoxysilane, (aminoethylaminomethyl)phenetyltrimethoxysilane, N-(2-aminoethyl-3-aminopropyl)tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxyethoxy)silane, 3-aminopropyltriethoxysilane, 3-aminopropyltrimethoxysilane, ω-aminoundecyltrimethoxysilane, 3-(2-N-benzylaminoethylaminopropyl)trimethoxysilane, bis(2-hydroxyethyl)-3-aminopropyltrimethoxysilane, (N,N-diethyl-3-aminopropyl)trimethoxysilane, (N,N-dimethyl-3-aminopropyl)trimethoxysilane, N-methylaminopropyltrimethoxysilane, N-phenylaminopropyltriethoxysilane, and 3-(N-styrylmethyl-2-aminoethylamino)propyltriethoxysilane.

Specific examples of the silane coupling agent having a carbon-carbon unsaturated double bond in the molecule include a silane coupling agent having at least one functional group selected from the group consisting of a methacryloxy group, a styryl group, a vinyl group, and an acryloxy group. In other words, examples of this silane coupling agent include compounds having at least one of a methacryloxy group, a styryl group, a vinyl group, or an acryloxy group as a reactive functional group, and further a hydrolyzable group such as a methoxy group or an ethoxy group. Examples of the silane coupling agent having a carbon-carbon unsaturated double bond in the molecule include the following silane coupling agents. Examples of a silane coupling agent having a methacryloxy group in the molecule include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane. Examples of a silane coupling agent having a styryl group in the molecule include p-styryltrimethoxysilane and p-styryltriethoxysilane. Examples of a silane coupling agent having a vinyl group in the molecule include vinyltriethoxysilane and vinyltrimethoxysilane. Examples of a silane coupling agent having an acryloxy group in the molecule include 3-acryloxypropyltrimethoxysilane and 3-acryloxypropyltriethoxysilane.

The chromium element amount can be adjusted, for example, by adjusting the thickness and the like of the layer containing chromium such as a chromate layer in the coating layer.

The nitrogen element can be allowed to exist by forming a layer using a silane coupling agent having an amino group in the molecule as a silane coupling agent layer. The amount of nitrogen element (nitrogen element amount) can be adjusted by adjusting the thickness and the like of the layer obtained using a silane coupling agent having an amino group in the molecule as a silane coupling agent layer.

The average roughness of the exposed surface is 2.0 µm or less, preferably 1.8 µm or less, more preferably 1.5 µm or less in terms of ten-point average roughness. It is considered that as the surface roughness of the exposed surface is lower, that is, as the smoothness of the exposed surface is higher, the smoothness of the contact surface between the copper foil and the insulating layer is also higher, and this is preferable from the viewpoint of being able to diminish the loss at the time of signal transmission. On the other hand, the limit of the surface roughness of the exposed surface is about 0.2 µm in terms of ten-point average roughness Rz even if the surface roughness of the exposed surface is decreased. When the surface roughness of the exposed surface is too low, it is considered that the smoothness of the contact surface between the copper foil and the insulating layer is too high, and the adhesiveness between the copper foil and the insulating layer tends to decrease. From this point as well, the surface roughness of the exposed surface is preferably 0.2 µm or more in terms of ten-point average roughness Rz. Hence, the surface roughness of the exposed surface is preferably 0.2 to 2.0 µm, more preferably 0.5 to 2.0 µm, still more preferably 0.6 to 1.8 µm, most preferably 0.6 to 1.5 µm in terms of ten-point average roughness Rz.

The ten-point average roughness Rz that is the surface roughness here conforms to JIS B 0601: 1994 and can be measured using a general surface roughness measuring instrument or the like. Specifically, the ten-point average roughness Rz can be measured using, for example, a surface roughness and shape measuring instrument (SURFCOM 500DX) manufactured by TOKYO SEIMITSU CO., LTD.

The average roughness of the exposed surface can be adjusted by adjusting the average roughness of the surface of the copper foil on the side in contact with the insulating layer. Specifically, the average roughness of the surface of the copper foil on the side in contact with the insulating layer is preferably 0.5 to 2.0 µm in terms of ten-point average roughness Rz. The surface of the copper foil having a large average roughness, the so-called M surface, is the surface on the side in contact with the insulating layer. It is only required that the coating layer as described above is formed on the M surface side. On the surface of the copper foil having a small average roughness, the so-called S surface, a coating layer as described above may be formed similarly to the M surface, but only the rust preventive layer may be formed or the coating layer may not be formed.

(Production Method)

The resin composition used in the present embodiment may be prepared in the form of a varnish and used. For example, when a prepreg is manufactured, the resin composition may be prepared in the form of a varnish and used for the purpose of impregnating the base material (fibrous base material) for forming the prepreg with the resin composition. In other words, the resin composition may be used as one (resin varnish) prepared in the form of a varnish. In the resin composition used in the present embodiment, the polymer, the curing agent, the polyphenylene ether compound and the like are dissolved in a resin varnish. Such a varnish-like composition (resin varnish) is prepared, for example, as follows.

First, the components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like composition is prepared. The organic solvent used here is not particularly limited as long as it dissolves the polymer and does not inhibit the curing reaction. Specific examples thereof include toluene and methyl ethyl ketone (MEK).

As described above, the insulating layer may contain not only a cured product of the resin composition but also a fibrous base material. Examples of this fibrous base material include those similar to the fibrous base material contained in the prepreg to be described later.

By using the resin composition, not only the copper-clad laminate but also a prepreg, a copper foil with resin, and a wiring board can be obtained as follows. At this time, the varnish-like composition as described above may be used as the resin composition.

Figure 2:
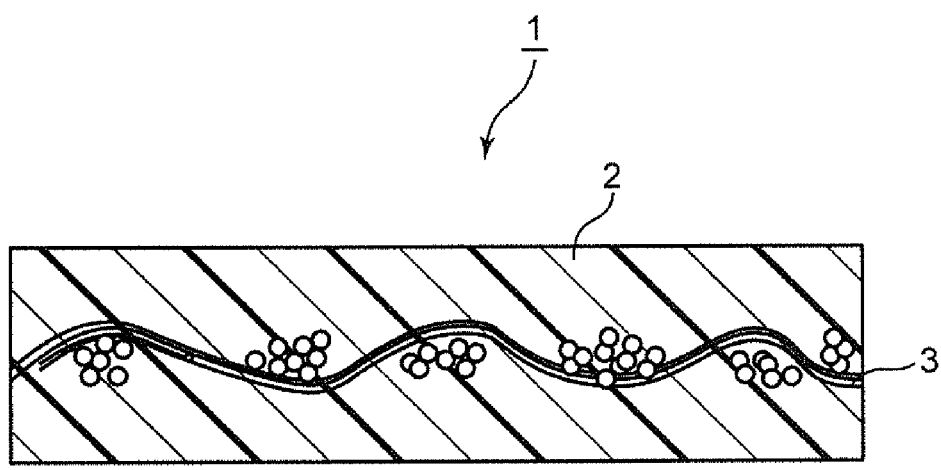
FIG. 2 is a schematic sectional view illustrating an example of a prepreg according to an embodiment of the present invention.

As illustrated in FIG. 2, the prepreg 1 includes the resin composition or a semi-cured product 2 of the resin composition and a fibrous base material 3. Examples of this prepreg 1 include those in which the fibrous base material 3 exists in the resin composition or the semi-cured product 2 of the resin composition. In other words, this prepreg 1 includes the resin composition or the semi-cured product 2 of the resin composition and the fibrous base material 3 existing in the resin composition or the semi-cured product 2 of the resin composition. FIG. 2 is a schematic sectional view illustrating an example of the prepreg 1 according to the present embodiment.

In the present embodiment, the semi-cured product is in a state in which the resin composition has been cured to an extent so that the resin composition can be further cured. In other words, the semi-cured product is in a state in which the resin composition has been semi-cured (B-staged). For example, when the resin composition is heated, the viscosity gradually decreases at first, and then curing starts, and the viscosity gradually increases. In such a case, the semi-cured state includes a state in which the viscosity has started to increase but curing is not completed, and the like.

The prepreg may contain a semi-cured product of the resin composition as described above or may contain the uncured resin composition itself. In other words, the prepreg may be a prepreg including a semi-cured product of the resin composition (the B-stage resin composition) and a fibrous base material or a prepreg including the resin composition before being cured (the A-stage resin composition) and a fibrous base material. Specific examples of the prepreg include those in which a fibrous base material exists in the resin composition. The resin composition or the semi-cured product of the resin composition may be one obtained by subjecting the resin composition to at least one of drying and heating.

The method of manufacturing the prepreg is not particularly limited as long as it is a method capable of manufacturing the prepreg. Examples of the method of manufacturing the prepreg include a method in which the fibrous base material is impregnated with the resin composition, for example, the resin composition prepared in the form of a varnish. In other words, examples of the prepreg include those obtained by impregnating a fibrous base material with the resin composition. The impregnation method is not particularly limited as long as it is a method capable of impregnating the fibrous base material with the resin composition. The impregnation method is not limited to dipping, and examples thereof include methods using rolls, die coats, and bar coats and spraying. As a method of manufacturing the prepreg, after the impregnation, the fibrous base material impregnated with the resin composition may be subjected to at least one of drying and heating. In other words, examples of the method of manufacturing the prepreg include a method in which a fibrous base material is impregnated with a resin composition prepared in the form of a varnish and then dried, a method in which a fibrous base material is impregnated with a resin composition prepared in the form of a varnish and then heated, and a method in which a fibrous base material is impregnated with a resin composition prepared in the form of a varnish, dried, and then heated.

Specific examples of the fibrous base material used in the manufacture of prepreg include glass cloth, aramid cloth, polyester cloth, liquid crystal plastic (LCP) non-woven fabric, glass non-woven fabric, aramid non-woven fabric, polyester non-woven fabric, pulp paper, and linter paper. When glass cloth is used, a laminate exhibiting excellent mechanical strength is obtained, and glass cloth subjected to flattening is particularly preferable. The glass cloth is not particularly limited, and for example, a glass cloth is preferable in which the relative dielectric constant of glass of the glass cloth or the glass yarn constituting the glass cloth is 5.0 or less and the dielectric loss tangent is 0.0033 or less. The relative dielectric constant is preferably 5.0 or less, more preferably 4.7 or less. The dielectric loss tangent is preferably 0.0033 or less, more preferably 0.0030 or less. Examples of the relative dielectric constant and the dielectric loss tangent here include the relative dielectric constant and the dielectric loss tangent at a frequency of 10 GHz. Specific examples of the glass cloth include E glass cloth, S glass cloth, NE glass cloth, L glass cloth, quartz glass (Q glass) cloth, QL glass cloth, and L2 glass cloth. The glass cloth may be used as it is, or a glass cloth of which the surface is treatment with a silane coupling agent may be used. Examples of this silane coupling agent include silane coupling agents having at least one functional group such as an amino group, a methacryloxy group, a styryl group, a vinyl group, or an acryloxy group in the molecule. In other words, examples of this silane coupling agent include compounds having at least one of an amino group, a methacryloxy group, a styryl group, a vinyl group, or an acryloxy group as a reactive functional group, and further a hydrolyzable group such as a methoxy group or an ethoxy group. The silane coupling agent is not particularly limited, and examples thereof include the following silane coupling agents. Examples of the silane coupling agent having an amino group in the molecule include N-(2-aminoethyl)-3-aminopropylmethyldimethoxysilane, N-(2-aminoethyl)-3-aminopropylmethyldiethoxysilane, 1-aminopropyltrimethoxysilane, 2-aminopropyltrimethoxysilane, 3-aminopropyltrimethoxysilane, 1,2-diaminopropyltrimethoxysilane, 3-amino-1-propenyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane, 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, 3-(N-phenyl)aminopropyltrimethoxysilane, N-(2-aminoethyl)-3-aminopropylethyldiethoxysilane, N-(2-aminoethyl)-3-aminopropyltriethoxysilane, 3-(N-styrylmethyl-2-aminoethylamino)propyltrimethoxysilane, bis(2-hydroxyethyl)-3-aminopropyltriethoxysilane, N-methylaminopropyltrimethoxysilane, N-(3-acryloxy-2-hydroxypropyl)-3-aminopropyltriethoxysilane, 4-aminobutyltriethoxysilane, (aminoethylaminomethyl)phenetyltrimethoxysilane, N-(2-aminoethyl-3-aminopropyl)tris(2-ethylhexoxy)silane, 6-(aminohexylaminopropyl)trimethoxysilane, aminophenyltrimethoxysilane, 3-(1-aminopropoxy)-3,3-dimethyl-1-propenyltrimethoxysilane, 3-aminopropyltris(methoxyethoxyethoxy)silane, 3-aminopropyltriethoxysilane, 3-aminopropyltrimethoxysilane, w-aminoundecyltrimethoxysilane, 3-(2-N-benzylaminoethylaminopropyl)trimethoxysilane, bis(2-hydroxyethyl)-3-aminopropyltrimethoxysilane, (N,N-diethyl-3-aminopropyl)trimethoxysilane, (N,N-dimethyl-3-aminopropyl)trimethoxysilane, N-methylaminopropyltrimethoxysilane, N-phenylaminopropyltriethoxysilane, and 3-(N-styrylmethyl-2-aminoethylamino)propyltriethoxysilane. Examples of a silane coupling agent having a methacryloxy group in the molecule include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane. Examples of a silane coupling agent having a styryl group in the molecule include p-styryltrimethoxysilane and p-styryltriethoxysilane. Examples of a silane coupling agent having a vinyl group in the molecule include vinyltriethoxysilane and vinyltrimethoxysilane. Examples of a silane coupling agent having an acryloxy group in the molecule include 3-acryloxypropyltrimethoxysilane and 3-acryloxypropyltriethoxysilane. Specifically, the flattening can be performed by, for example, continuously pressing the glass cloth at an appropriate pressure using a press roll to flatly compress the yarn. As the thickness of the fibrous base material, for example, one having a thickness of 0.01 to 0.3 mm can be generally used.

The impregnation of the fibrous base material with the resin composition (resin varnish) is performed by immersion, coating and the like. If necessary, it is possible to repeat this impregnation a plurality of times. At this time, it is also possible to finally adjust the composition and impregnated amount to the desired composition and impregnated amount by repeating the impregnation using a plurality of resin compositions having different compositions and concentrations.

The fibrous base material impregnated with the resin composition (resin varnish) is heated under desired heating conditions, for example, at 80° C. to 180° C. for 1 to 10 minutes. By heating, the solvent is volatilized from the resin varnish and the solvent is decreased or removed to obtain a prepreg before being cured (A stage) or in a semi-cured state (B stage).

The method of manufacturing the copper-clad laminate according to the present embodiment is not particularly limited as long as the copper-clad laminate can be manufactured. As the method of manufacturing the copper-clad laminate, for example, a copper-clad laminate can be obtained in the same manner as a general method of manufacturing a copper-clad laminate except that the resin composition and the copper foil are used. Examples thereof include a method in which the prepreg is used. Examples of a method of fabricating a copper-clad laminate using a prepreg include a method in which one sheet or a plurality of sheets of prepreg are stacked, the copper foil is further stacked on both or one of upper and lower surfaces of the prepregs so that the copper foils and the prepregs come into contact with each other, and the stacked copper foils and prepregs are heat-press molded to be laminated and integrated. In other words, the method of manufacturing the copper-clad laminate includes a step of obtaining the resin composition, a step of impregnating a fibrous base material with the resin composition to obtain a prepreg, and a step of stacking the copper foil on the prepreg and heat-press molding the stacked copper foils and prepregs to obtain a copper-clad laminate including an insulating layer containing a cured product of the resin composition and a copper foil existing to be in contact with at least one surface of the insulating layer. By this method, a copper-clad laminate including a copper foil on both surfaces or a copper-clad laminate including a copper foil on one surface can be fabricated. The heating and pressing conditions can be appropriately set depending on the thickness of the laminate to be manufactured, the kind of the resin composition contained in the prepreg, and the like. For example, it is possible to set the temperature to 170° C. to 210° C., the pressure to 3.5 to 4 MPa, and the time to 60 to 150 minutes. The copper-clad laminate may be manufactured without using a prepreg. Examples of the method include a method in which a varnish-like resin composition or the like is applied onto the copper foil to form a layer containing a curable composition on the copper foil and then heating and pressing is performed.

[Wiring Board]

Figure 3:
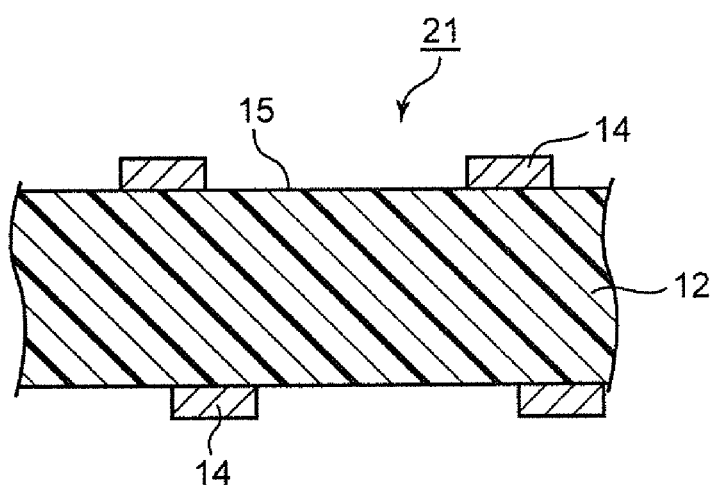
FIG. 3 is a schematic sectional view illustrating an example of a wiring board according to an embodiment of the present invention.

The wiring board according to another embodiment of the present invention includes wiring formed by partially removing the copper foil provided in the copper-clad laminate and the insulating layer. In other words, as illustrated in FIG. 3, this wiring board 21 includes the insulating layer 12 and wiring 14, formed by partially removing the copper foil provided in the copper-clad laminate, on both surfaces of the insulating layer 12. The wiring board may be provided with wiring in contact with only one surface of the insulating layer. FIG. 3 is a sectional view illustrating the configuration of the wiring board 21 according to the present embodiment.

The wiring board 21 includes an insulating layer 12 and wiring 14 that exists to be in contact with at least one surface of the insulating layer 12. Examples of the wiring board 21 include a wiring board in which a surface 15 of the insulating layer 12 existing between the wirings 14 is a surface as described below similarly to the exposed surface. The chromium element amount on the surface 15 measured by XPS is 7.5 at % or less with respect to the total element amount measured by XPS. The surface roughness of the surface 15 is 2.0 μm or less in terms of ten-point average roughness. It is considered that the etching residue remains on the surface 15 corresponding to this exposed surface, but the insulating layer 12 includes the surface 15 corresponding to this exposed surface.

Examples of the insulating layer 12 include a layer similar to the insulating layer of the copper-clad laminate. Examples of the wiring 14 include wiring formed by partially removing the copper foil of the copper-clad laminate. Examples of such wiring include wiring formed by a method using subtractive, additive, semi additive process (SAP), modified semi additive process (MSAP), chemical mechanical polishing (CMP), trenching, inkjetting, squeegeeing, transfer, or the like.

This copper-clad laminate has a high signal transmission speed and high heat resistance. It is considered that this is because the wiring board is obtained using the copper-clad laminate. Specifically, as described above, it is considered that this is because the occurrence of delamination can be sufficiently suppressed since the amount of the compound containing a chromium element which exists between the wirings is small. It is considered that the signal transmission speed is high because the insulating layer has a low dielectric constant and a low dielectric loss tangent and the smoothness of the contact surface between the wiring and the insulating property is high as described above.

Figure 4:
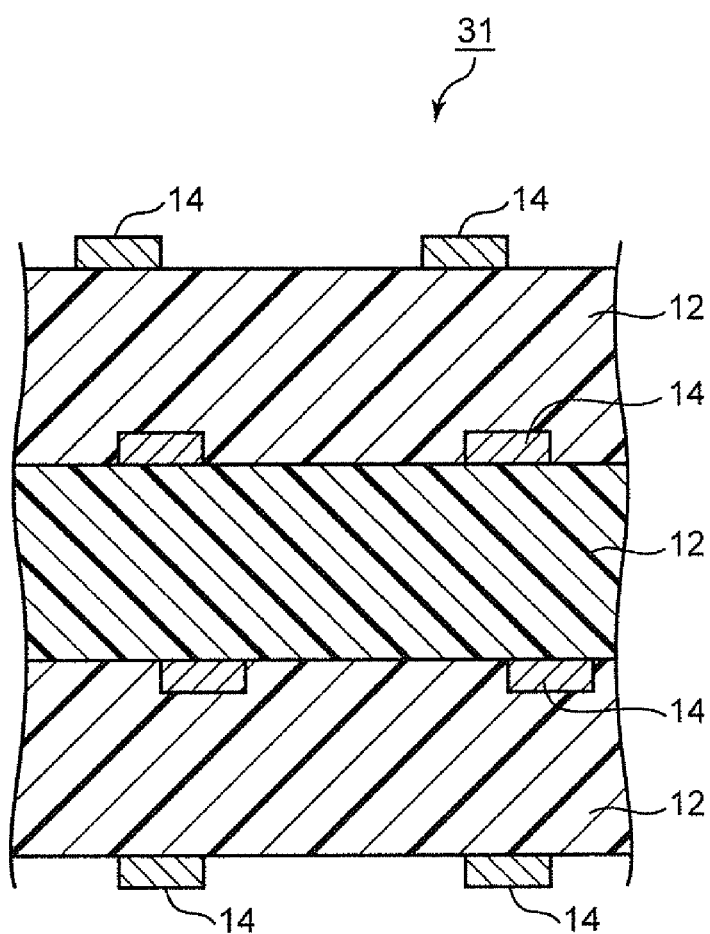
FIG. 4 is a schematic sectional view illustrating another example of a wiring board according to an embodiment of the present invention.

The wiring board according to the present embodiment may have one insulating layer as illustrated in FIG. 3 or may have a plurality of insulating layers as illustrated in FIG. 4. In the case of having a plurality of the insulating layers, the wiring may be disposed on the surfaces of the plurality of the insulating layers as illustrated in FIG. 4 or may be disposed between the insulating layers. As illustrated in FIG. 4, a wiring board 31 according to the present embodiment has a plurality of the insulating layers 12. In the wiring board 31, the wiring 14 is disposed between the insulating layers 12. FIG. 4 is a schematic sectional view illustrating another example of the wiring board 31 according to an embodiment of the present invention.

The wiring board as illustrated in FIG. 4 is manufactured as follows, for example. The prepreg is stacked on at least one surface of a wiring board as illustrated in FIG. 3 and, if necessary, a copper foil is stacked on the prepreg, and heat-press molding is performed. The copper foil on the surface of the laminate thus obtained is subjected to etching and the like to form wiring. A multilayer wiring board as illustrated in FIG. 4 can be thus manufactured.

Such a wiring board is a multilayer wiring board having a high signal transmission speed and high heat resistance. Specifically, the wiring board is a multilayer wiring board, exhibits high heat resistance, and is unlikely to cause delamination even when being heated, and it is possible to suppress the occurrence of delamination between the insulating layers even when the wiring is disposed between the insulating layers.

[Copper Foil with Resin]

Figure 5:
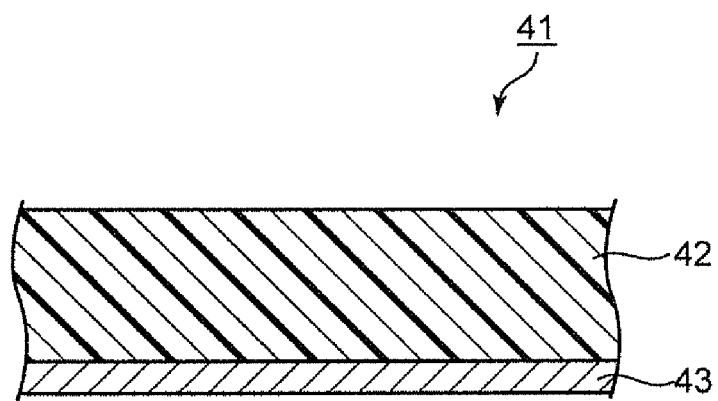
FIG. 5 is a schematic sectional view illustrating an example of a copper foil with resin according to an embodiment of the present invention.

The copper foil with resin according to another embodiment of the present invention includes a resin layer and a copper foil existing to be in contact with one surface of the resin layer. As illustrated in FIG. 5, this copper foil with resin 41 includes a resin layer 42 and a copper foil 43 disposed so as to be in contact with one surface of the resin layer 42. FIG. 5 is a sectional view illustrating the configuration of the copper foil with resin 41 according to the present embodiment.

The resin layer 42 contains the resin composition (the resin composition in A stage) as described above or a semi-cured product of the resin composition (the resin composition in B stage). The resin layer is only required to contain the resin composition or a semi-cured product of the resin composition and may or may not contain a fibrous base material. As the fibrous base material, those similar to the fibrous base materials of the prepreg can be used. The copper foil 43 is similar to the copper foil provided in the copper-clad laminate. The chromium element amount, on the exposed surface on which the cured resin layer is exposed by an etching treatment of the copper foil existing to be in contact with the surface of the cured resin layer with a copper chloride solution when the resin layer provided in the copper foil with resin is cured, measured by X-ray photoelectron spectroscopy is 7.5 at % or less with respect to the total element amount measured by X-ray photoelectron spectroscopy, and the surface roughness of the exposed surface is 2.0 μm or less in terms of ten-point average roughness.

From such a copper foil with resin, a wiring board having a higher signal transmission speed and higher heat resistance can be suitably manufactured.

First, in such a copper foil with resin, the resin layer contains a resin composition containing the polymer or a semi-cured product of the resin composition. From this fact, it is considered that the heat resistance of the insulating layer can be enhanced when the copper foil with resin is used in the manufacture of a wiring board, since the insulating layer obtained by curing the resin layer contains a cured product obtained by curing the resin composition or a semi-cured product of the resin composition.

It is considered that an etching residue derived from the copper foil exists on the exposed surface on which the cured resin layer is exposed by an etching treatment of the copper foil existing to be in contact with the surface of the cured resin layer with a copper chloride solution when the resin layer provided in the copper foil with resin is cured. It is considered that when the amount of chromium element existing on the exposed surface as this etching residue is small as described above, the amount of chromium element also existing on the surface of the insulating layer existing between the wirings in the wiring board, namely, the amount of a compound containing a chromium element is small when the copper foil with resin is used in the manufacture of a wiring board. From this fact, it is considered that the copper foil with resin exhibits high heat resistance so that delamination can be sufficiently suppressed even when heating is performed.

From the above, it is considered that the copper foil with resin exhibits high heat resistance.

The insulating layer obtained by curing the resin layer contains a cured product obtained by curing the resin composition or a semi-cured product of the resin composition. This cured product includes a cured product obtained by curing a resin composition containing the modified polyphenylene ether compound. Hence, the insulating layer obtained by curing the resin layer has a low dielectric constant and a low dielectric loss tangent. From this fact, it is considered that it is possible to diminish the transmission loss caused by the dielectric around the wiring and increase the signal transmission speed in this wiring board.

It is considered that the smoothness of the contact surface between the copper foil and the resin layer is also high since the surface roughness of the exposed surface is low. From this fact, it is considered that the smoothness of the contact surface between the wiring and the insulating layer obtained by curing the resin layer is also high when the copper foil with resin is used in the manufacture of a wiring board. It is considered that the signal for transmitting the wiring is concentrated near the surface of the conductor constituting the wiring by the skin effect. It is considered that this effect is more remarkable as the signal for transmitting the wiring has a higher frequency. As the contact surface between the wiring and the insulating layer is smooth, the signal flowing through the wiring flows near the surface having high smoothness and the transmission distance is shorter. From this fact, it is considered that it is possible to diminish the transmission loss caused by the conductor forming the wiring and increase the signal transmission speed in this wiring board.

From this fact, it is considered that it is possible to diminish the transmission loss caused by the conductor forming the wiring and the transmission loss caused by the dielectric around the wiring and increase the signal transmission speed in this wiring board.

From the above, it is considered that the copper foil with resin is a copper foil with resin from which a wiring board having a high signal transmission speed and high heat resistance can be suitably manufactured.

The method of manufacturing the copper foil with resin according to the present embodiment is not particularly limited as long as it is a method capable of manufacturing the copper foil with resin. As the method of manufacturing the copper foil with resin, for example, a copper foil with resin can be obtained in the same manner as a general method of manufacturing a copper foil with resin except that the resin composition and the copper foil are used. Examples of the method of manufacturing the copper foil with resin include a method in which the resin composition, for example, a resin composition prepared in the form of a varnish is applied onto the copper foil. In other words, examples of the copper foil with resin according to the embodiments of the present invention include those obtained by applying the resin composition onto the copper foil. The application method is not particularly limited as long as it is a method capable of applying the resin composition onto the copper foil. Examples thereof include methods using rolls, die coats, and bar coats, and spraying. As the method of manufacturing the copper foil with resin, the copper foil coated with the resin composition may be subjected to at least one of drying and heating after the application. In other words, examples of the method of manufacturing the copper foil with resin include a method in which a resin composition prepared in the form of a varnish is applied onto a copper foil and then dried, a method in which a resin composition prepared in the form of a varnish is applied onto a copper foil and then heated, and a method in which a resin composition prepared in the form of a varnish is applied onto a copper foil, dried, and then heated. The copper foil coated with the resin composition is heated under desired heating conditions, for example, at 80° C. to 180° C. for 1 to 10 minutes to obtain a copper foil with resin before being cured (A stage) or in a semi-cured state (B stage).

According to the present invention, it is possible to provide a copper-clad laminate and a copper foil with resin from which a wiring board having a high signal transmission speed and high heat resistance can be suitably manufactured. According to the present invention, it is also possible to provide a wiring board having a high signal transmission speed and high heat resistance.

Hereinafter, the present invention will be described more specifically with reference to Examples, but the scope of the present invention is not limited thereto.

EXAMPLES

Examples 1 to 7 and Comparative Examples 1 to 4

The respective components used when preparing resin compositions in the present Examples will be described.
(Polymer)
Polymer: polymer obtained by the following method.
Into a 5.0 L reactor, 3.6 mol (468 g) of divinylbenzene, 2.2 mol (290.4 g) of ethylvinylbenzene, 9.2 mol (956.8 g) of styrene, and 15 mol (1532 g) of n-propyl acetate were added, and stirring was performed. The mixture obtained by this stirring was heated to 70° C., then 600 mmol of boron trifluoride-diethyl ether complex was added thereto, and stirring was further performed at 70° C. for 4 hours to react divinylbenzene, ethylvinylbenzene, and styrene. Thereafter, a saturated aqueous sodium hydrogen carbonate solution was added to the reaction solution in the reactor to stop the reaction. The organic layer separated by the addition was then washed with pure water three times. This washed organic layer was volatilized under reduced pressure at 60° C. to obtain a polymer.

The obtained polymer was a polymer having a structural unit represented by Formula (1) in the molecule [an aromatic polymer having a structural unit derived from a bifunctional aromatic compound in which two carbon-carbon unsaturated double bonds are bonded to an aromatic ring, a compound having structural units represented by Formulas (5) to (7), weight average molecular weight Mw: 31100, vinyl equivalent (equivalent of the vinyl group contained in the structural unit represented by Formula (1), where $R_1$ to $R_3$ are each a hydrogen atom): 380].

The equivalent (vinyl equivalent) of the vinyl group contained in the structural unit represented by Formula (1), where $R_1$ to $R_3$ are each a hydrogen atom, of the polymer was calculated through iodine value measurement by the Wyeth method. Specifically, the compound to be measured was first dissolved in chloroform so that the concentration was 0.3 g/35 mL to 0.3 g/25 mL. Excess amount of iodine chloride was added to the double bonds present in this solution. By doing so, the double bond was reacted with iodine chloride, this reaction was allowed to proceed sufficiently, and then an aqueous potassium iodide solution at 20% by mass was added to the solution after being subjected to the reaction to extract the iodine component remaining in the solution after being subjected to the reaction into the aqueous phase in the form of $I_3^-$. This aqueous phase into which $I_3^-$ was extracted was titrated with an aqueous sodium thiosulfate solution (0.1 mol/L sodium thiosulfate standard solution), and the iodine value was calculated. The following equation was used to calculate the iodine value.

Iodine value=$[(B-A)\times F\times 1.269]$/mass of compound (g)

In the equation, B denotes the titration volume (cc) of the 0.1 mol/L sodium thiosulfate standard solution required for the blank test, A denotes the titration volume (cc) of 0.1 mol/L sodium thiosulfate standard solution required for neutralization, and F denotes the titer of sodium thiosulfate.

(Curing Agent)

DVB: Divinylbenzene (thermosetting curing agent having two carbon-carbon unsaturated double bonds at molecular terminal, DVB810 manufactured by NIPPON STEEL CORPORATION, molecular weight: 130)

TAIC: Triallyl isocyanurate (thermosetting curing agent having three carbon-carbon unsaturated double bonds at molecular terminal, TAIC manufactured by Nihon Kasei CO., LTD., weight average molecular weight Mw: 249)

Acenaphthylene: Acenaphthylene manufactured by JFE Chemical Corporation

DCP: Tricyclodecanedimethanol dimethacrylate (NK Ester DCP manufactured by Shin-Nakamura Chemical Co., Ltd.)

(Polyphenylene Ether Compound: PPE)

Modified PPE:

Modified polyphenylene ether obtained by modifying terminal hydroxyl groups of polyphenylene ether with methacryl groups (a modified polyphenylene ether compound having a structure represented by Formula (19), where $R_{15}$ is a methyl group and Y is a dimethylmethylene group (represented by Formula (16), where $R_{44}$ and $R_{45}$ are a methyl group), SA9000 manufactured by SABIC Innovative Plastics, intrinsic viscosity (IV): 0.085 dl/g in methylene chloride at 25° C., weight average molecular weight Mw: 2000, number of terminal functional groups: 1.8)

(Others)

Epoxy compound: Dicyclopentadiene epoxy resin (HP-7200 manufactured by DIC Corporation)

Phenolic novolac resin: Phenol novolac resin (TD2131 manufactured by DIC Corporation) (Initiator)

PBP: α,α'-Di(t-butylperoxy)diisopropylbenzene (Perbutyl P (PBP) manufactured by NOF CORPORATION)

(Catalyst)

Imidazole compound: 2-Ethyl-4-methylimidazole (2E4MZ manufactured by Shikoku Chemicals Corporation)

(Flame Retardant)

Flame retardant: SAYTEX 8010 manufactured by Albemarle Corporation (Filler)

Silica 1: Spherical silica treated with vinylsilane (SC2300-SVJ manufactured by Admatechs Company Limited)

Silica 2: Spherical silica treated with epoxy silane (SC2500-SEJ manufactured by Admatechs Company Limited)

[Method of Preparing Resin Composition]

Next, a method of preparing a resin composition will be described.

First, the respective components other than the initiator were added to and mixed in toluene at the blending proportions presented in the following Table 3 so that the solid concentration was 60% by mass. The mixture was heated to 80° C. and stirred at 80° C. for 60 minutes. Thereafter, the stirred mixture was cooled to 40° C., and then the initiator was added thereto at the blending proportion presented in the following Table 3 to obtain a varnish-like curable composition (varnish). The mixture was stirred for 60 minutes to prepare a varnish-like resin composition (varnish).

[Method of Fabricating Copper-Clad Laminate]

Next, the obtained varnish was impregnated into a glass cloth and then heated and dried at 100° C. to 170° C. for about 3 to 6 minutes to fabricate a prepreg. Specifically, the glass cloth is #1078 type L glass manufactured by Asahi Kasei Corporation. At that time, the content (resin content) of the resin composition was adjusted to be about 66% by mass.

Next, two sheets of manufactured prepregs were superposed, the following copper foils presented in Table 3 were disposed on both sides of the superposed two prepregs to form a body to be pressed, and heating and pressing was performed for 100 minutes under the conditions of a temperature of 200° C. and a pressure of 3 MPa (megapascals) to fabricate a copper-clad laminate in which a copper foil was attached to both surfaces.

(Copper Foil)

Copper foil-1: Copper foil of which the entire surface is subjected to a surface treatment with a silane coupling agent having an amino group in the molecule (TLC-V1 manufactured by Nan Ya Plastics Corporation, copper foil treated with aminosilane, amount of chromium attached on M surface: 1.8 at %, ten-point average roughness Rz of M surface: 1.3 μm, thickness: 18 μm)

Copper foil-2: Copper foil of which the entire surface is subjected to a surface treatment with a silane coupling agent having an amino group in the molecule (FX-WS manufactured by Tairi Furukawa Copper Foil Co., Ltd., copper foil treated with aminosilane, amount of chromium attached on M surface: 7.4 at %, ten-point average roughness Rz of M surface: 1.3 μm, thickness: 18 μm)

Copper foil-3: Copper foil of which the entire surface is subjected to a surface treatment with a silane coupling agent having an amino group in the molecule (FV-WS (amino) manufactured by The Furukawa Electric Co., Ltd., copper foil treated with aminosilane, amount of chromium attached on M surface: 7.4 at %, ten-point average roughness Rz of M surface: 1.3 μm, thickness: 18 μm)

Copper foil-4: Copper foil of which the entire surface is subjected to a surface treatment with a silane coupling agent having a vinyl group in the molecule (FV-WS (vinyl) manufactured by The Furukawa Electric Co., Ltd., copper foil treated with vinylsilane, amount of chromium attached on M surface: 7.4 at %, ten-point average roughness Rz of M surface: 1.3 μm, thickness: 18 μm)

Copper foil-5: Copper foil of which the entire surface is subjected to a surface treatment with a silane coupling agent having an amino group in the molecule (MLS-G manufactured by MITSUI MINING & SMELTING CO., LTD., copper foil treated with aminosilane, amount of chromium attached on M surface: 2.2 at %, ten-point average roughness Rz of M surface: 2.8 μm, thickness: 18 μm)

[Chromium Element Amount and Nitrogen Element Amount]

The obtained copper-clad laminate was etched with a cupric chloride solution (liquid temperature: 45° C.) for 90 seconds and then washed with city water or pure water at room temperature. By doing so, the copper foil was removed.

The surface element analysis by XPS was performed on the surface (exposed surface) of the insulating layer exposed by the etching treatment. This surface elemental analysis was performed at a position where the photoelectrons emitted by the ionization of the sample were able to be detected at the strongest intensity by irradiating the M surface (contact surface) with X-rays under the following conditions from the direction perpendicular to the M surface in a vacuum and adjusting the irradiation height. As XPS, the measurement was performed under the following conditions using PHI 5000 Versaprobe manufactured by ULVAC-PHI, INCORPORATED.

X-ray used: Monochrome Al-Kα ray

X-ray beam diameter: About 100 μm φ (25 W, 15 kV)

Region analyzed: About 100 μm φ

The value acquired by the measurement was quantitatively converted using the relative sensitivity coefficient incorporated in the analysis software provided in the apparatus.

As a result, the chromium element amount and nitrogen element amount with respect to the total element amount measured by XPS were measured.

[Surface Roughness Rz]

The surface roughness (ten-point average roughness Rz) of the exposed surface, the ten-point average roughness Rz that is the surface roughness here, was measured using a surface roughness and shape measuring instrument (SURFCOM 500DX) manufactured by TOKYO SEIMITSU CO., LTD. in conformity with JIS B 0601: 1994.

[Evaluation]

The copper-clad laminate (evaluation substrate) was evaluated by the methods described below.

[Transmission Loss]

One metal foil (copper foil) of the evaluation substrate (metal-clad laminate) was processed to form ten wirings having a line width of 100 to 300 μm, a line length of 1000 mm, and a line spacing of 20 mm. A three-layer plate was fabricated by secondarily stacking two sheets of the prepreg and the metal foil (copper foil) on the surface of the substrate on which this wiring has been formed on the side on which the wiring has been formed. The line width of the wiring was adjusted so that the characteristic impedance of the wiring after the three-layer plate was fabricated was 50Ω.

The transmission loss (passing loss) (dB/m) of the wiring formed on the obtained three-layer plate at 12.5 GHz was measured using a network analyzer (N5230A developed by Keysight Technologies).

[Solder Heat Resistance]

When the evaluation substrate was fabricated, prepregs were stacked one by one on the front and back of the copper-clad laminate of which the entire surface had been etched, and heating and pressing was performed for 100 minutes under the conditions of a temperature of 200° C. and a pressure of 3 MPa to obtain a copper-clad laminate in which a copper foil was attached to both surfaces. This formed copper-clad laminate was cut into 50 mm×50 mm and the copper foils on both surfaces were removed by etching. The laminate for evaluation thus obtained was immersed in a solder bath at 288° C. for 30 seconds. Thereafter, the immersed laminate was visually observed to confirm the occurrence of swelling. Two laminates were subjected to this observation. It was evaluated as "Very Good" if swelling was not confirmed (if the number of swelling occurrences was 0). It was evaluated as "Good" if the number of swelling occurrences was 1, and it was evaluated as "Poor" if the number of swelling occurrences was 2.

[Boiling Solder Heat Resistance 1]

A laminate for evaluation was obtained in the same manner as in the evaluation of solder heat resistance, and the evaluation was performed in the same manner as the evaluation of solder heat resistance except that the laminate for evaluation was immersed in boiling ion-exchanged water for 4 hours before being immersed in a solder bath at 288° C. for 30 seconds. The evaluation criteria were also similar to those in the evaluation of solder heat resistance.

[Boiling Solder Heat Resistance 2]

A laminate for evaluation was obtained in the same manner as in the evaluation of solder heat resistance, and the evaluation was performed in the same manner as the evaluation of solder heat resistance except that the laminate for evaluation was immersed in boiling ion-exchanged water for 6 hours before being immersed in a solder bath at 288° C. for 30 seconds. The evaluation criteria were also similar to those in the evaluation of solder heat resistance.

The results of the respective evaluations are presented in Table 3. For each copper-clad laminate, it is indicated that the copper foil marked with "Yes" in the column of copper foil in Table 3 was used.

TABLE 3

| | | | Examples | | | | | | | Comparative Example | | | |
|---|---|---|---|---|---|---|---|---|---|---|---|---|---|
| | | | 1 | 2 | 3 | 4 | 5 | 6 | 7 | 1 | 2 | 3 | 4 |
| Composition (parts by mass) | Polymer | | 70 | 70 | 70 | 70 | 40 | 70 | 70 | 70 | 40 | — | 70 |
| | Curing agent | DVB | 30 | — | — | — | 30 | 30 | 30 | 30 | 30 | — | 30 |
| | | TAIC | — | 30 | — | — | — | — | — | — | — | — | — |
| | | Acenaphthylene | — | — | 30 | — | — | — | — | — | — | — | — |
| | | DCP | — | — | — | 30 | — | — | — | — | — | — | — |
| | PPE | Modified PPE | — | — | — | — | 30 | — | — | — | 30 | — | — |
| | Epoxy compound | | — | — | — | — | — | — | — | — | — | 60 | — |
| | Phenolic novolac resin | | — | — | — | — | — | — | — | — | — | 40 | — |
| | Initiator | PBP | 2 | 2 | 2 | 2 | 2 | 2 | 2 | 2 | 2 | — | 2 |
| | Catalyst | Imidazole compound | — | — | — | — | — | — | — | — | — | 0.05 | — |
| | Flame retardant | | 22 | 22 | 22 | 22 | 22 | 22 | 22 | 22 | 22 | 22 | 22 |
| | Filler | Silica 1 | 60 | 60 | 60 | 60 | 60 | 60 | 60 | 60 | 60 | — | 60 |
| | | Silica 2 | — | — | — | — | — | — | — | — | — | 60 | — |
| Copper foil | Copper foil-1 | | Yes | Yes | Yes | Yes | Yes | — | — | — | — | Yes | — |
| | Copper foil-2 | | — | — | — | — | — | Yes | — | — | — | — | — |
| | Copper foil-3 | | — | — | — | — | — | — | Yes | — | — | — | — |
| | Copper foil-4 | | — | — | — | — | — | — | — | Yes | Yes | — | — |
| | Copper foil-5 | | — | — | — | — | — | — | — | — | — | — | Yes |
| XPS analysis | Chromium element amount (at %) | | 0.5 | 0.5 | 0.4 | 0.4 | 0.3 | 5.7 | 6.9 | 7.9 | 7.6 | 0.1 | 0.3 |
| | Nitrogen element amount (at %) | | 4.5 | 3.5 | 3.8 | 4.3 | 4.0 | 1.3 | 2.0 | — | — | 2.5 | 1.0 |
| | Surface roughness Rz (μm) | | 1.1 | 1.1 | 1.1 | 1.1 | 1.1 | 1.0 | 1.1 | 1.1 | 1.1 | 1.1 | 2.8 |
| Evaluation | Transmission loss (dB/m) | | -19 | -19 | -19 | -19 | -19 | -19 | -19 | -19 | -19 | -60 | -23 |
| | Solder heat resistance | | Very Good | Very Good | Very Good | Very Good | Very Good | Very Good | Very Good | Very Good | Very Good | Very Good | Very Good |
| | Boiling solder heat resistance 1 | | Very Good | Very Good | Very Good | Very Good | Very Good | Good | Good | Poor | Poor | Poor | Very Good |
| | Boiling solder heat resistance 2 | | Good | Good | Good | Good | Good | Good | Good | Poor | Poor | Poor | Very Good |

As can be seen from Table 3, in the cases (Examples 1 to 7) of copper-clad laminates obtained using copper foils in which the chromium element amount on the exposed surface obtained by XPS measurement was 7.5 at % or less and the surface roughness of the exposed surface was 2.0 μm or less in terms of ten-point average roughness, the transmission loss was lower and the heat resistance was higher as compared with other cases (Comparative Examples 1 to 4). For example, the copper-clad laminates according to Examples 1 to 7 exhibited higher heat resistance as compared with the cases (Comparative Example 1 and Comparative Example 2) where the chromium element amount exceeded 7.5 at %. The copper-clad laminates according to Examples 1 to 7 had a lower transmission loss as compared with the case (Comparative Example 3) where the insulating layer was not a resin composition containing the modified polyphenylene ether compound but was a resin composition containing an epoxy compound and a phenol novolac compound. The copper-clad laminates according to Examples 1 to 7 had a lower transmission loss as compared with the case (Comparative Example 4) where the surface roughness of the exposed surface exceeded 2.0 μm in terms of ten-point average roughness.

This application is based on Japanese Patent Application No. 2019-194375 filed on Oct. 25, 2019, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there are provided a copper-clad laminate and a copper foil with resin from which a wiring board having a high signal transmission speed and high heat resistance can be suitably manufactured. According to the present invention, there is also provided a wiring board having a high signal transmission speed and high heat resistance.

The invention claimed is:

1. A copper-clad laminate comprising:
an insulating layer; and
a copper foil existing to be in contact with at least one surface of the insulating layer,
wherein the insulating layer contains a cured product of a resin composition containing a polymer having a structural unit represented by the following Formula (1) in a molecule, the copper foil having a layer treated with a silane coupling agent having an amino group in the molecule as a silane coupling agent layer,
a chromium element amount, on an exposed surface on which the insulating layer is exposed by an etching treatment of the copper-clad laminate with a copper chloride solution, measured by X-ray photoelectron spectroscopy is 7.5 at % or less with respect to a total element amount measured by X-ray photoelectron spectroscopy, and
a surface roughness of the exposed surface is 1.1 μm or less in terms of ten-point average roughness, and wherein a thickness of the silane coupling agent layer is sufficient to cause a nitrogen element amount, on the exposed surface, measured by X-ray photoelectron spectroscopy to be 1.0 at % to 5.0 at % with respect to a total element amount measured by X-ray photoelectron spectroscopy:

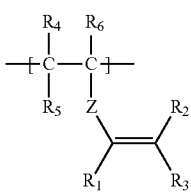

(1)

wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.

2. The copper-clad laminate according to claim 1, wherein the nitrogen element is derived from a nitrogen atom contained in a compound having an amino group.

3. The copper-clad laminate according to claim 1, wherein the structural unit represented by Formula (1) includes a structural unit represented by the following Formula (2):

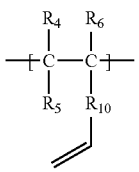

(2)

wherein in Formula (2), $R_4$ to $R_6$ each independently represent a hydrogen atom or an alkyl group having 1 to 6 carbon atoms and $R_{10}$ represents an arylene group having 6 to 12 carbon atoms.

4. The copper-clad laminate according to claim 3, wherein the structural unit represented by Formula (2) includes a structural unit represented by the following Formula (3):

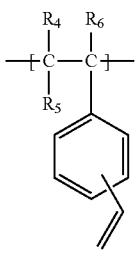

(3)

wherein in Formula (3), $R_4$ to $R_6$ each independently represent a hydrogen atom or an alkyl group having 1 to 6 carbon atoms.

5. The copper-clad laminate according to claim 1, wherein the polymer includes a polymer further having a structural unit represented by the following Formula (4) in a molecule:

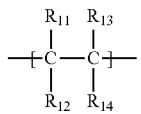

(4)

wherein in Formula (4), $R_{11}$ to $R_{13}$ each independently represent a hydrogen atom or an alkyl group having 1 to 6 carbon atoms and $R_{14}$ represents an aryl group.

6. The copper-clad laminate according to claim 5, wherein the aryl group in the structural unit represented by Formula (4) has an alkyl group having 1 to 6 carbon atoms.

7. The copper-clad laminate according to claim 1, wherein a weight average molecular weight of the polymer is 1,500 to 40,000.

8. The copper-clad laminate according to claim 1, wherein an equivalent of a vinyl group contained in the structural unit represented by Formula (1), where $R_1$ to $R_3$ are each a hydrogen atom, of the polymer is 250 to 1200 g/mol.

9. The copper-clad laminate according to claim 1, wherein the resin composition further contains a polyphenylene ether compound.

10. A wiring board comprising:
wiring formed by partially removing the copper foil provided in the copper-clad laminate according to claim 1; and
the insulating layer.

11. The wiring board according to claim 10, comprising a plurality of the insulating layers,
wherein the wiring is disposed between the insulating layers.

12. A copper foil with resin comprising:
a resin layer; and
a copper foil existing to be in contact with at least one surface of the resin layer, the copper foil having a layer treated with a silane coupling agent having an amino group in the molecule as a silane coupling agent layer,
wherein the resin layer contains a resin composition containing a polymer having a structural unit represented by the following Formula (1) in a molecule or a semi-cured product of the resin composition,
a chromium element amount, on an exposed surface on which the cured resin layer is exposed by an etching treatment of the copper foil existing to be in contact with a surface of the cured resin layer with a copper chloride solution when the resin layer provided in the copper foil with resin is cured, measured by X-ray photoelectron spectroscopy is 7.5 at % or less with respect to a total element amount measured by X-ray photoelectron spectroscopy, and
a surface roughness of the exposed surface is 1.1 um or less in terms of ten-point average roughness , and
wherein a thickness of the silane coupling agent layer is sufficient to cause a nitrogen element amount, on the exposed surface, measured by X-ray photoelectron spectroscopy to be 1.0 at % to 5.0 at % with respect to a total element amount measured by X-ray photoelectron spectroscopy:

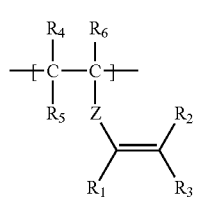 (1)
wherein in Formula (1), Z represents an arylene group, $R_1$ to $R_3$ each independently represent a hydrogen atom or an alkyl group, and $R_4$ to $R_6$ each independently represent a hydrogen atom or an alkyl group having 1 to 6 carbon atoms.
* * * * *